United States Patent [19]

Kato

[11] Patent Number: 5,525,550
[45] Date of Patent: Jun. 11, 1996

[54] PROCESS FOR FORMING THIN FILMS BY PLASMA CVD FOR USE IN THE PRODUCTION OF SEMICONDUCTOR DEVICES

[75] Inventor: Takashi Kato, Kawasaki, Japan

[73] Assignee: Fujitsu Limited, Kawasaki, Japan

[21] Appl. No.: 154,538

[22] Filed: Nov. 19, 1993

[30] Foreign Application Priority Data

| May 21, 1991 | [JP] | Japan | 3-116237 |
| Apr. 27, 1992 | [JP] | Japan | 4-107271 |
| Nov. 20, 1992 | [JP] | Japan | 4-312423 |

[51] Int. Cl.$^6$ ............... H01L 21/316; H01L 21/318
[52] U.S. Cl. .................................. 437/238; 437/241
[58] Field of Search .................................. 437/235, 238, 437/239, 240, 243, 244, 241

[56] References Cited

U.S. PATENT DOCUMENTS

| 4,002,512 | 1/1977 | Lim . | |
| 4,196,232 | 4/1980 | Schnable et al. | 527/255.3 |
| 4,732,761 | 3/1988 | Machida et al. | 437/228 |
| 4,877,641 | 10/1989 | Dory | 427/38 |
| 4,937,094 | 6/1990 | Doehler et al. | 427/38 |
| 4,999,314 | 3/1991 | Pribat et al. | 437/89 |
| 5,314,724 | 5/1994 | Tsukune et al. | 427/489 |
| 5,424,253 | 6/1995 | Usami et al. | 437/238 |
| 5,429,995 | 7/1995 | Nishiyama et al. | 437/238 |

FOREIGN PATENT DOCUMENTS 5-121568  5/1993  Japan .

OTHER PUBLICATIONS

Wolf, 'Si. Proc. For The VLSI ERA', vol. 1 (1986).
"Formation of Plasma CVD–SiO$_2$ Using H$_2$O and SiH$_4$", Kato et al., Extended Abstracts (The 53rd Autumn Meeting, 1992), The Japan Society of Applied Physics, p. 577, with English Translation.

Primary Examiner—Matthew Whipple
Attorney, Agent, or Firm—Nikaido, Marmelstein, Murray & Oram

[57] ABSTRACT

A silicon oxide film is formed by a CVD process, with the use of a silane group gas and water as a main feed gas. Further, a film including silanol is formed by the plasma CVD process with a specific plasma energy, using the silane group gas and water as the main feed gas. The specific plasma energy is selected at 40 (W·°C./cm$^2$) or below. By annealing this film including silanol, or by performing the oxygen plasma process or the ammonia plasma process, the oxide film or the nitride film is formed.

8 Claims, 25 Drawing Sheets

H₂O : 100 sccm
SiH₄ : 5 sccm
pressure : 3 Torr
RF : 100W

FIG. 25

|  | (i) | (ii) | (iii) |
|---|---|---|---|
|  | thermal oxide film | conventional low-temparature CVD oxide film | (water+SiH$_4$) oxide film of the invention |
| dielectric breakdown (MV/cm) | 10 | 4 | 9 |
| interface state (cm$^{-2}$eV$^{-1}$) | <10$^{10}$ | 5×10$^{11}$ | <10$^{10}$ |

PROCESS FOR FORMING THIN FILMS BY PLASMA CVD FOR USE IN THE PRODUCTION OF SEMICONDUCTOR DEVICES

BACKGROUND OF THE INVENTION

1. Field of the Invention

The present invention relates to a process for forming a thin film by using plasma CVD for use in the production of a semiconductor device. More particularly, it relates to a process for forming a thin film by using plasma CVD for use in the production of a semiconductor device including the step of covering minute drop portions, which are formed on multi-layered wirings according to the miniaturized shape of elements with an insulating film having a flatness and a reliability. Further, it relates to a semiconductor device including multi-layered insulating films formed by the step for forming the insulating film.

2. Related Prior Art

In relation to a semiconductor integrated circuit device (LSI), circuit elements, such as active elements or passive elements and so on are formed on a semiconductor substrate, and the circuit elements are inter-connected by a wiring layer formed on an insulating film deposited on those elements.

However, in recent years, LSI has become highly-integrated, and the size of circuit elements has been miniaturized, so that the drop of the foundation forming the insulating film becomes steeper.

Further, highly-integrated LSI requires the use of multi-layered wirings in order to connect between structural elements. As the multi-layered wirings are formed via an insulating film on the drop portion, the lower wiring and the upper wiring can cause short-circuits via a defective portion of an inter-insulating film when the inter-insulating film is not perfectly formed.

Furthermore, the upper wiring portion becomes thinner at the steep drop portion and results in a high resistance, and is cut down when the drop portion remains without forming it flat, so that there is the possibility of lowering the reliability of LSIs.

In conventional processes, the insulating film is formed by a process such as the CVD (Chemical Vapor Deposition) process. However, it is impossible to perfectly cover the steeply dropped portions of the surface of a substrate. This is because the quality of covering of the insulating film is not good. For example, as described in Japanese unexamined patent application No. 4-111424, the covering is currently improved by coating SOG (Spin On Glass) using a spinner process or using an organic gas, for example, TEOS [Tetraethoxy silane : Si $(OC_2H_5)_4$] and the like, as a feed gas. The resulting insulating film, however, is not significantly improved over conventional processes.

Further, a process was also employed in which the film was reflowed by annealing after deposition for flattening the surface thereof, and the insulating film having relatively low-melting point, such as PSG (Phospho-silicate Glass), and BPSG (Boron-doped Phospho-silicate Glass) had to be used in such a conventional process. It was required to subject the insulating film, such as PSG and BPSG to reflow-treatment at a high temperature of about 900° C. or above as the above-described, so that there was a limit as to the feasibility of this process.

Further, in the above-case, it was known that the anneal temperature could be lowered when annealing with water vapor. However, it has not been put to practical use because of a significant reduction in the quality of the insulating film when annealing in the water vapor in this way.

SUMMARY OF THE INVENTION

It is therefore an object of the present invention to provide a process for producing a semiconductor device, which includes a step by which a flat and reliable insulating layer, even on the minute drop portion can be formed according to miniaturization of the formation of elements to solve the problems associated with the prior art.

It is another object of the present invention to provide a semiconductor device having a multi-layered insulating film formed by said step.

It is a still another object of the present invention to provide a process for forming a silicon oxide film by the CVD process, using a silane group gas and water as a feed gas to form an insulating film with a flatness and a reliability on a minute drop portion.

It is a further object of the present invention to provide a process for forming a silicon oxide film with a step of appending an organic silane gas or the impurity having a fluidity of $PH_3$, $B_2H_6$, $A_sH_3$ and the like to the feed gas or a step for exciting at least one material selected from the silane group gas, an organic silane gas and water continuously or intermittently by plasma, light and the like.

It is a still further object of the present invention to provide a process for forming an oxide film including the steps of forming a film with an inorganic silanol at first by using a silane group gas and water as a feed gas due to the plasma CVD process with energy of lower than a specific value and of heating up the film to transfer it to an oxide film.

It is another object of the present invention to provide a process for forming a nitride film including steps of forming a film with an inorganic silanol at first by using a silane group gas and water as a feed gas due to the plasma CVD process with an energy of lower than a specific value and of performing an ammonia plasma process on the film to transfer it to the nitride film.

Other objects and advantages of the present invention will become apparent from the detailed description to follow taken in conjunction with the appended claims.

BRIEF DESCRIPTION OF THE DRAWINGS

The accompanying drawings, which constitute a part of the specification, illustrate presently preferred embodiments of the invention, and together with the general description given above and the detailed description of the preferred embodiments given below, serve to explain the principles of the invention, wherein:

FIG. 25 is a diagram showing a comparison in relation to gate oxide films of a MOS diode, each grown by each sort of processes for forming the gate oxide films.

PREFERRED EMBODIMENTS OF THE INVENTION

Figure 1:
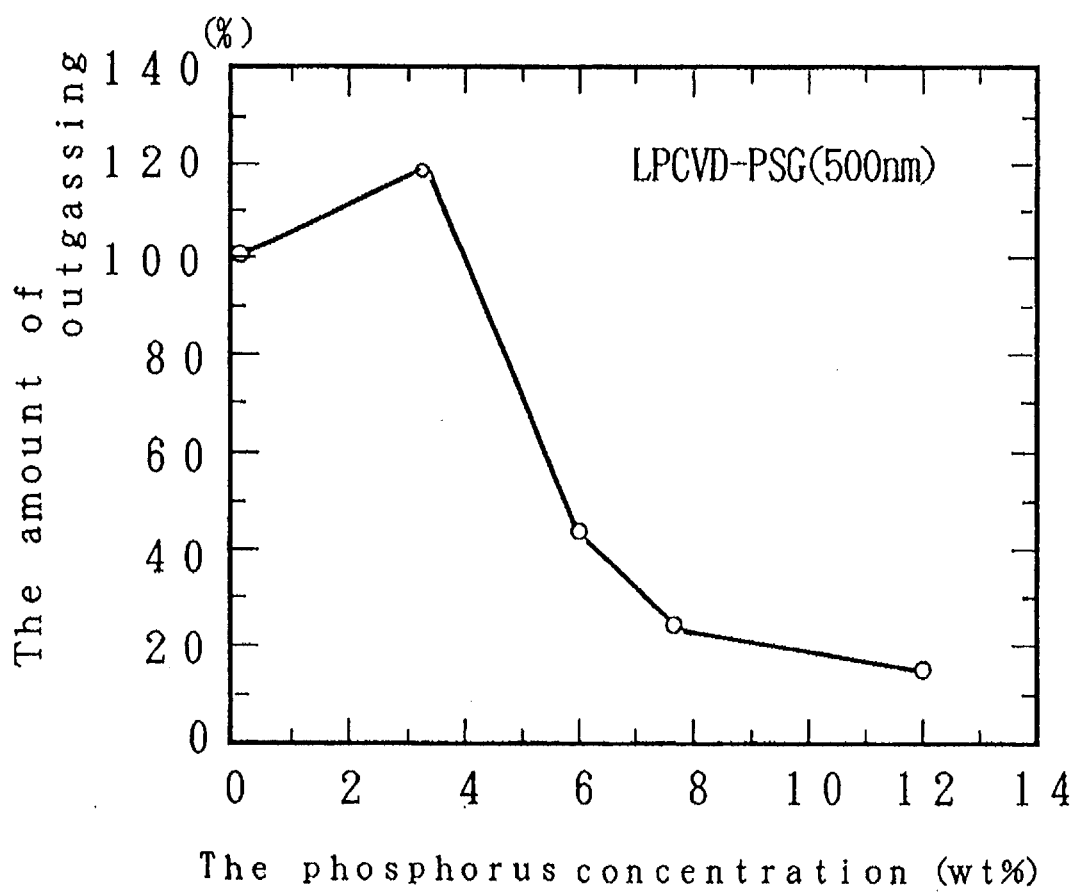
FIG. 1 is a diagram showing the relationship between the phosphorus concentration and the amount of outgassing in the PSG film.

The inventor of the present invention investigated the deterioration of insulating covering by experimentation in relation to conventional processes for forming an insulating film. As the result of this investigation, it was found out that the covering of the insulating film was affected greatly by sticking or adhesion probability to the growing foundation. Covering is also negatively affected in cases where the feed gas is of a gas group that shows a gaseous phase reaction thereto.

The inventor of the present invention succeeded in solving said problem by using material which is mixed of a silane group gas ($Si_nH_{2n+2}$) and water in a state of water vapor ($H_2O$) as a feed gas and forming a silicon oxide film by a CVD process.

That is, as a silane group gas and water vapor have no quick reaction in the state of gaseous phase, a silicon oxide film is not formed by any gaseous phase reaction quickly during a supply step, even if these are mixed and supplied to the reactor chamber.

The water molecule has a larger sticking or adhesion probability for the material used as a foundation than the silane molecule. Therefore, water is adsorbed on a foundation (the silicon substrate, $SiO_2$, the metal and the like) with the formation of $H_2O$ or OH at first, and then, the silicon oxide ($SiO_2$) is formed by reacting the silane molecule with $H_2O$ or OH adsorbed earlier.

When the surface of the foundation is evenly covered by a silicon oxide film, silane is not adsorbed thereupon. Further, the reaction occurs such that water molecules are adsorbed on the surface of the silicon oxide foundation at first, and then the silicon oxide film is formed depending on reacting the silane molecules with $H_2O$ or OH.

Therefore, the surface reaction evenly occurs. The amount of the reaction is very small, even if the gaseous phase reaction with the silane molecule and $H_2O$ or OH is made during growth at high-temperature. The silane molecule, having the smaller sticking probability, is supplied to and stays at the surface and therefore, a sufficient amount of the molecule is maintained. Then, the silane molecule is reacted at only the near surface on $H_2O$ or OH which has deeply entered and been adsorbed at first to the end or lower portion of the drop portion, or the trench or contact hole due to the larger sticking probability to form a silicon oxide film, and therefore, the growth of the silicon oxide film is limited by the amount of the adsorbed $H_2O$ or OH. Further, the covering of the silicon oxide ($SiO_2$) film is improved, since the adsorption of $H_2O$ or OH is uniform.

By forming the silicon oxide film by means of further appending an organic gas including silicon, such as organic silane gas, TEOS (tetraethoxy silane) gas, TMOS (tetramethoxy silane) gas, or TMS (tetramethyl silane) gas to the silane group gas or water vapor, the insulating layer can be evenly and flatly deposited, according to a further mode of the invention. Further, by combining those two modes, it is also possible to form a multi-layered insulating film composed of a silicon insulating film having an excellent film quality and another silicon insulating film having a suitable flatness.

First, a silicon oxide film having a good film quality is formed by using the silane group gas and the oxide gas or water vapor as a feed gas according to the first mode of the present invention. Then, the silicon oxide film is flattened by mixing an organic silane gas into the feed gas according to the second mode of the present invention. Further, by repeating this operation, silicon oxide films each having a good film quality having a flat surface can be laminated, as multi-layered.

In the first mode, a feed gas used for the formation of a silicon oxide film according to the present invention is composed of a silane group gas and water, which are preferably the gas volumetric ratio 1:100~1:1, and preferably 1:10~1:2; the feed gas is supplied by a carrier gas (for example, Ar and $N_2$) which is preferably the volumetric % of 50~100% with the silane group gas and water.

In the second mode, the organic silane gas is appended preferably in the volumetric % of 0.1~60%, more, preferably 10~30% to 100 of the total amount of said silane group gas and water.

The CVD equipment used for the formation of the silicon oxide film according to the present invention may be conventional, and having a temperature of 200°~800° C. and the decompression or atmospheric CVD of the pressure 0.1~760 Torr.

Furthermore, the inventor of the present invention found out that the silicon oxide film can be deposited in a state of liquidity and be flattened, when phosphine ($PH_3$), diborane ($B_2H_6$), arsine ($A_sH_3$) and so on are appended into the feed gas.

In this step, as described above, not only the inorganic group gas of the phosphine, the diborane, the arsine and so on can be used, but also the doping impurity gas of the organic group of $P(CH_3)_3$, $P(C_2H_5)_3$, $B(CH_3)_3$, $B(C_2H_5)_3$, $A_s(CH_3)_3$, $A_s(C_2H_5)_3$ and the like can be used as the impurity having fluidity thereof.

In this case, the fluidity of the silicon oxide film on the growth is higher and the flatness is therefore improved.

Furthermore, in this case, when water is intermittently supplied to the silane group gas and the oxide gas or the impurity having a fluidity of the phosphine and so on is intermittently supplied to the silane group gas and the oxide gas, the silicon oxide film which does not have a fluidity but has a good film quality and the silicon oxide film which becomes inferior somewhat but has a fluidity are formed alternately; a silicon oxide film having an intermediate characteristic between the both films is thereby formed.

It was also determined that the growing silicon oxide film can be made more minute and can be further flattened by the means of plasma discharging, exciting and activating at least one material selected from the silane group gas, the organic silane gas and water used as the feed gas by a microwave, a high-frequency, or a direct current (DC) electric field.

Moreover, it was found out through experimentation that it is required to excite by plasma discharging and the like, in order to react these gases, as water and the silane group gas are difficult to react at the low temperature of 200°~600° C.

More particularly, the formation of the inter-insulating film for employing multi-layered Al wirings is preferably formed by the plasma CVD process.

It was further determined that the growing silicon oxide film can be made more minute or flattened, if the feed gas or the oxide gas is also excited by light, such as ultraviolet and so on or electro-magnetic waves other than plasma.

Water is absorbed by leaving the oxide film in an atmosphere and the water is released by heating the oxide film. It is required to minimize this heating step, as this water release makes a reliability of Al wirings lower.

FIG. 1 is a diagram showing the relation between the phosphorus concentration and the amount of outgassing in a PSG film.

The abscissa shows the phosphorus concentration and the ordinate axis shows the amount of outgassing in this diagram. As apparent from the drawing, it can be understood that the amount of outgassing is sharply reduced at the time of 4% or above of the phosphorus concentration.

However, as the problem of reliability is caused by the dissolution depending on water of $P_2O_5$, when phosphorus becomes 8% or above, it is preferably to limit the phosphorus concentration within 8%.

The inventor of the present invention determined that the phosphorus concentration which is introduced on the fixed amount or above of $PH_3$ is limited, at the result of the experimentation which is performed to change the rate of $PH_3$, as shown in the following chart 1, by the decompression CVD process of 2.9 Torr of which reaction temperature is 420° C., the water ($H_2O$) supply amount is 100 sccm and the high frequency electric power is 100 V.

That is, the phosphous concentration is proportionally increased, until the amount of supplying $PH_3$/Ar is the extent of 10 sccm. However, the amount of phosphorus introduced is not increased at above 10 sccm.

| 20% $PH_3$Ar (sccm) | P (wt %) |
|---|---|
| 2 | 1.8 |
| 5 | 5.0 |
| 10 | 6.8 |
| 15 | 7.1 |
| 20 | 7.6 |
| 40 | 7.7 |

The chart shows that the film which has a small outgassing and the suitable concentration of the solvent of $P_2O_5$ is automatically formed.

The amount of silane and the amount of $PH_3$ become saturated at the same level, and the phosphorus concentration is not increased, even if $PH_3$ is increased above the level.

It is considered that the reason is because of keeping the balance between the solvent depending on water of $P_2O_5$ and the introduced amount.

Figure 2:
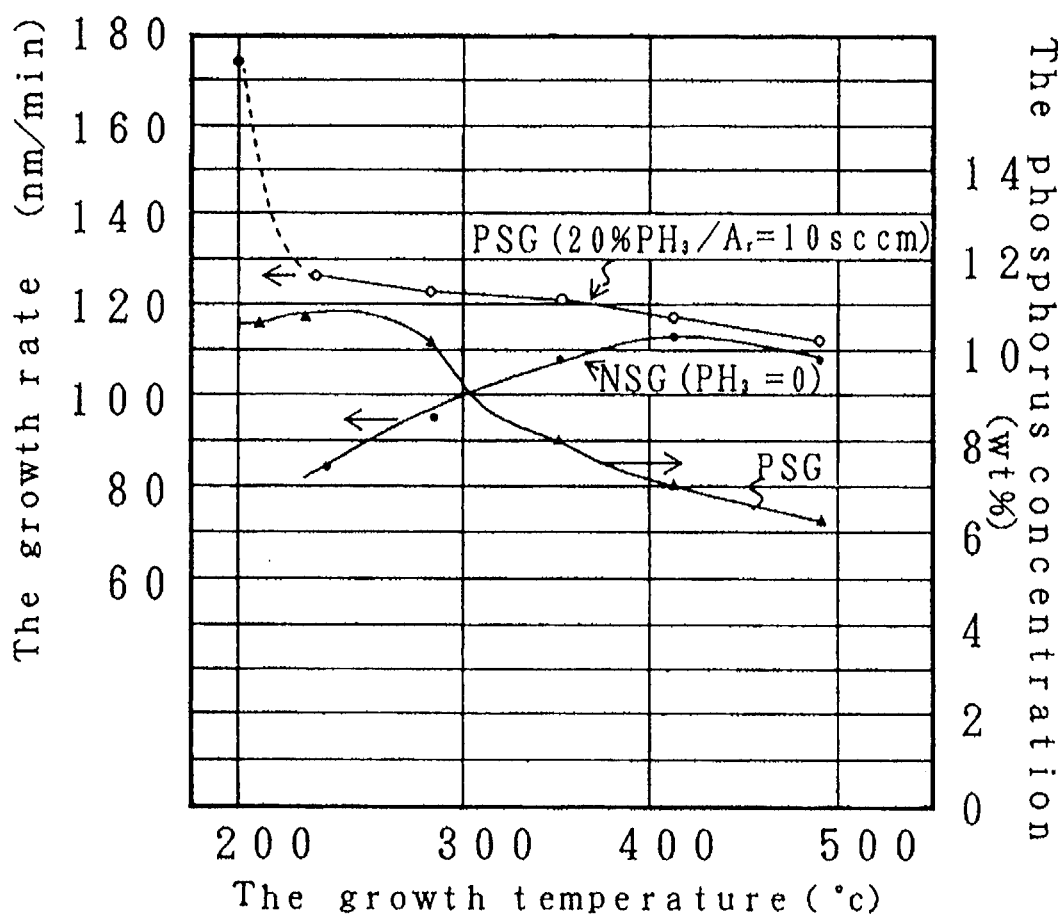
FIG. 2 is a diagram showing the relation of the growth temperature, the growth rate of NSG and PSG, and the phosphorus concentration of PSG.

FIG. 2 is a diagram showing the relationship of the growth temperature, the growth rates of NSG and PSG and the phosphorus concentration of PSG.

As is apparent from this diagram, it can be recognized that the phosphorus concentration is increased as the temperature decreases. It is because of keeping $PH_3$ constant with 10 sccm to become constant at adjacent to 260° C. and it shows the mass transport limited. The phosphorus concentration becomes constant on the extent of 7% at 400° C. or above and the trend continues until coming to the extent of 600° C. of temperature for starting pyrolysis.

That is, it is required for forming the inter-insulating film having a high reliability at low temperature by supplying $PH_3$ having the same level as $SiH_4$ and applying plasma (RF) at the growth temperature of 400°~600° C.

Further, by paying attention to the fluidity, it is preferable to make the phosphorus concentration higher, so that growth can be performed at 400° C. or below. But, it is not preferable to make the temperature too low, because the quality of the film lowers sharply.

As shown in FIG. 2, the growth rate is increased sharply and the quality of the film decreases when the growth temperature is at 200° C. or below, as shown in the broken line.

From these facts, it is preferable for forming the inter-insulating film having favorable flatness and reliability to laminate the layers by repeating the formation at 400°~600° C. and the formation at 200°~400° C. alternately.

On the other hand, it was determined by the inventor of the present invention that the film including an inorganic silanol (Si(OH)x) is formed by a plasma CVD process, when a silane group gas and $H_2O$ are used as the feed gas. The film fulfills the relationship between the low-plasma power which is lower than the specific value and the temperature.

Figure 3:
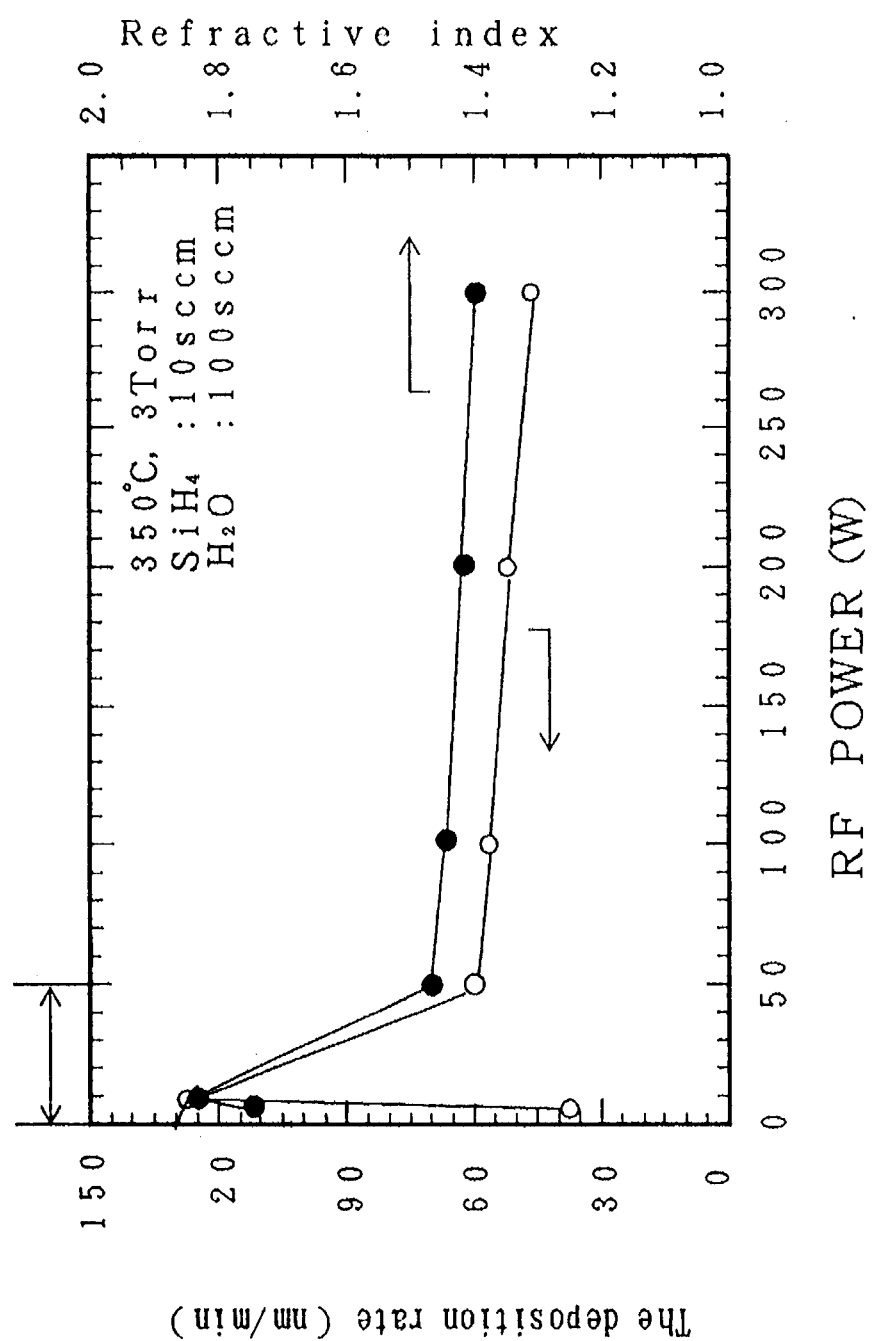
FIG. 3 is a diagram showing the relationship between the deposition rate and the plasma power when the insulating film is grown by a plasma CVD process.

FIG. 3 is a diagram showing the relationship between the deposition rate and the plasma RF power when the insulating film is grown by a plasma CVD process, which is obtained from the measurement by the inventor of the present invention. The conditions for growth are a temperature of 350° C., a pressure of 3 Torr, a $SiH_4$ flow rate of 10 sccm and a $H_2O$ flow rate of 100 sccm.

In this diagram, it can be understood that there is a peculiar growth in the deposition rate when the RF power is 50 W (0.2 W/cm$^2$) or below. Accordingly, the condition wherein the RF power which is 50 W (0.2 W/cm$^2$) or below was further observed.

Figure 4:
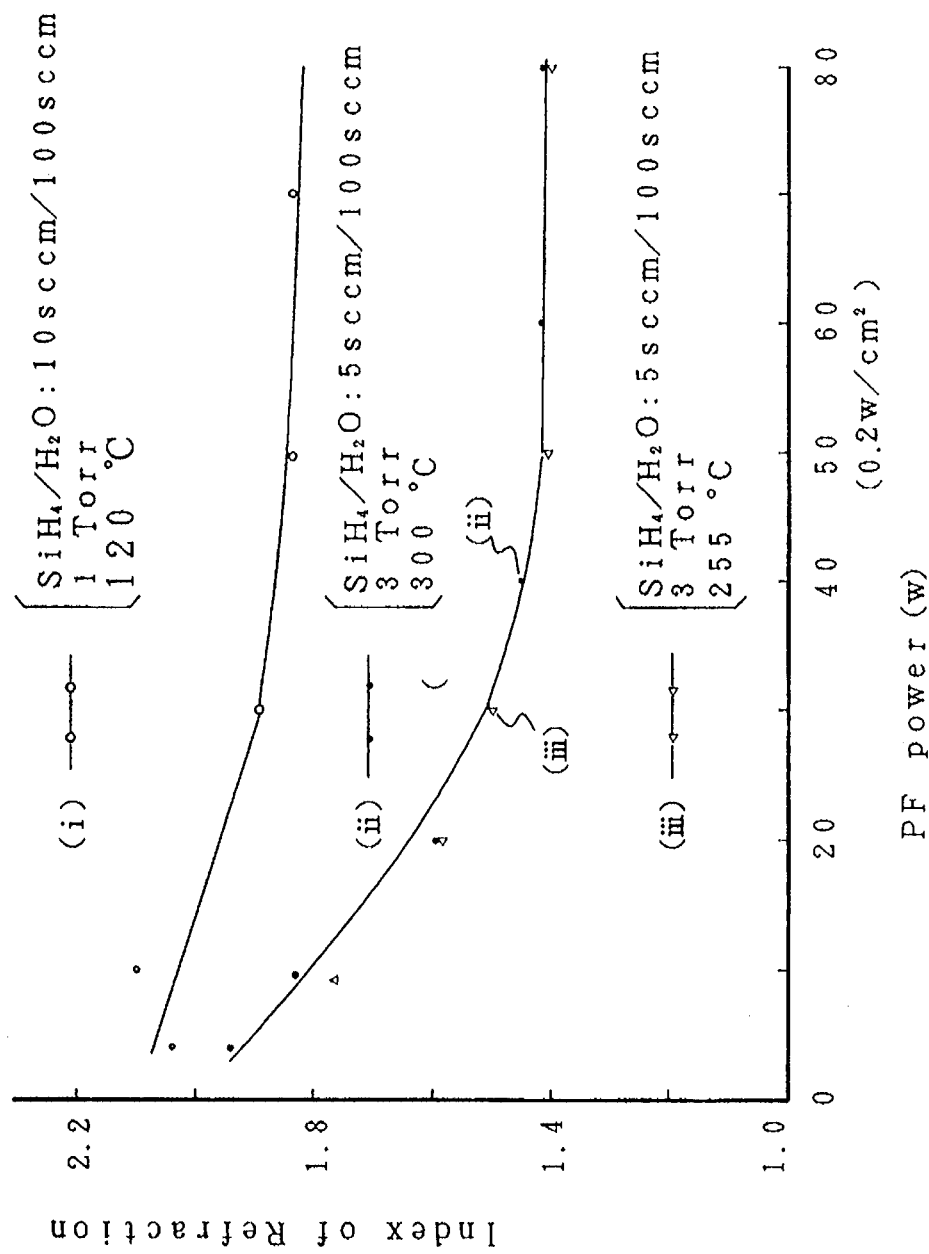
FIG. 4 is a diagram showing the relationship between the plasma RF power and the index of refraction of the deposited film.

FIG. 4 is a graphic chart showing the index of refraction of the film formed by changing the RF power, when the insulating film is grown by a plasma CVD process. In FIG. 4, the conditions for growing the film are a temperature of 120° C., a pressure of 1 Torr, a $SiH_4$ flow rate of 10 sccm and a $H_2O$ flow rate of 100 sccm in the case of (i). Further, it is a temperature of 300° C., a pressure of 3 Torr, a $SiH_4$ flow rate of 5 sccm and a flow rate of 100 sccm in the case of (ii), and it is a temperature of 225° C., a pressure of 3 Torr, a $SiH_4$ flow rate of 5 sccm and a $H_2O$ flow rate of 100 sccm in the case of (iii).

As is apparent from FIG. 4, it can be understood that the same modification of the index of refraction is shown at 300° C. and 225° C., wherein the growth temperature is 200° C. or above, and the larger value than the index of refraction of the usual $SiO_2$ on the RF power which is 50 W or below is shown. This means that the bond of Si-OH and Si-H becomes larger, so that an inorganic silanol is formed. The film formed in this way has a great fluidity and good flatness. Further, when it grows slowly, the film provides a good covering and a high quality.

When the insulating film is grown by this plasma CVD process, more particularly, when it is performed by a plasma CVD process at 200° C. or above, it is required to use RF power of 50 W (0.2 W/cm$^2$) or below. In the case of (i) as above-described, wherein the growth temperature is 120° C., it shows a larger value than the index of refraction of usual $SiO_2$ by the RF power of 50 W (0.2 W/cm$^2$) or below. However, it has a larger index of refraction of usual $SiO_2$ than the case of (ii) and (iii), wherein the growth temperature is higher. This is because the growth temperature is also related to exciting energy as is the plasma power.

When it is contrary to a condition of a low exciting energy, wherein the exciting energy becomes larger, Si-OH bonding is broken, so that Si-O bonding and $H_2O$ are formed. That is, a $SiO_2$ layer is formed without forming Si(OH)x, when the density of plasma power is higher. Although such an experiment is usually not performed because the discharge is not stabilized when the plasma power becomes 50 W or below, it was also determined by the inventor of the present invention that the discharge is stabilized by using $H_2O$ as the feed gas.

As described above, the consideration of the excitation by the plasma and the temperature of heating requires consideration of the effect of the growth temperature. Further, the inventor of the present invention is found out that the rate of depositing the film is suddenly lowered at 200° C. or below in consequence of changing and observing the temperature by keeping 100 W of the plasma power constant.

Accordingly, as both the plasma power and heat are the exciting energy, it is required to consider (power)x (heat), judging from the synergistic effect.

The inorganic silanol is formed on the excision energy of 200×0.2=40 (°C·W/cm$^2$) or below for the first time. By fulfilling this condition, an inorganic silanol can be formed by making the plasma power higher, even if the temperature is 200° C. or below.

The embodiment which was performed by the inventor of the present invention to lead to the above-described data and the conclusion will be explained as follows;

FIRST EMBODIMENT

Figure 5:
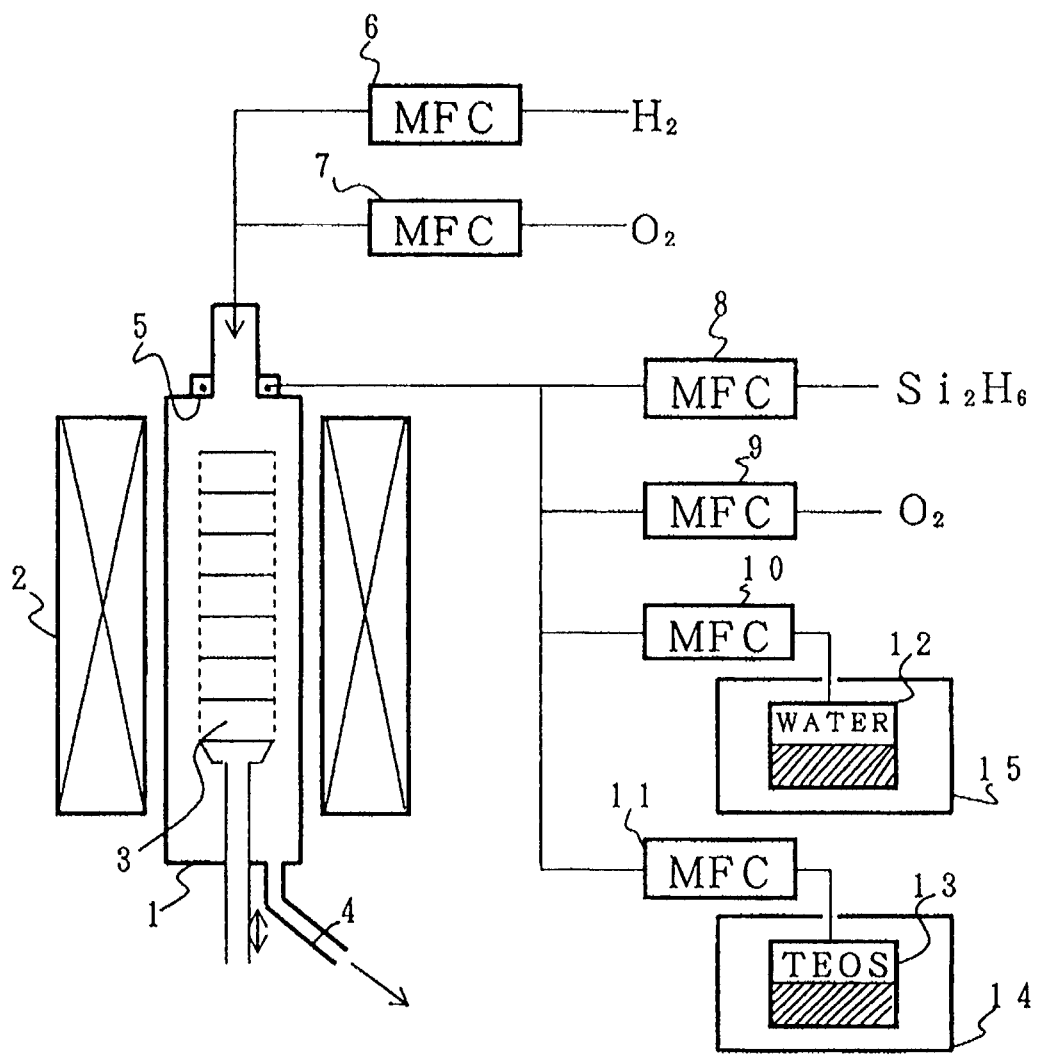
FIG. 5 is a structural diagram explaining an outline of batch type CVD silicon oxide film formation equipment employed in a first embodiment of the present invention.

FIG. 5 is an explanatory diagram showing the structure of the outline of batch type CVD silicon oxide film formation equipment.

In this diagram, 1 is a reactor tube, 2 is a heater, 3 is a silicon wafer, 4 is an exhaust port, 5 is a shower nozzle, 6, 7, 8, 9, 10 and 11 are mass flow controllers (MFC), 12 is a water supply unit, 13 is a TEOS supply unit and 14 and 15 are constant-temperature tubs.

In the batch type CVD silicon oxide film formation equipment employed in this embodiment, as shown in FIG. 5, a plurality of silicon wafers 3 are arranged with a predetermined space between each other on the equal heat zone of a quartz reactor tube 1 provided with the heater 2 therearound.

The organic silane gas of silane ($SiH_4$), disilane ($Si_2H_6$), trisilane ($Si_3H_8$), tetraethoxy silane (TEOS), tetramethyl silane (TMS) and the like as the silicon feed gas, and oxygen ($O_2$) or water vapor ($H_2O$) as the oxide gas, are supplied to the reactor tube 1 and exhausted from the exhaust port 4.

Further, hydrogen ($H_2$) and oxygen ($O_2$) which have a high purity of the fixed amount (mole ratio is $H_2:O_2=2:1$) are supplied as the oxide gas, respectively through mass-flow controllers (MFC) 6 and 7, and heated at the reactor tube 1 to provide water vapor.

Besides hydrogen ($H_2$) and oxygen ($O_2$) described above, oxygen ($O_2$) can be introduced as the oxide gas via MFC 9, as is known in the prior art.

Further, it is also possible to supply $H_2O$ via MFC 10 from the water supply unit 12 in the constant temperature tub 15 as an alternative to producing $H_2O$ by the means of heating the hydrogen and oxygen.

It is further proposed that disilane ($Si_2H_6$) or the like which is the silicon feed gas can be supplied from the supply nozzle of the feed gas via MFC 8 into the reactor tube 1, downstream of the area for producing $H_2O$ by the means of heating the hydrogen and oxygen.

It is furthermore proposed that the organic silicon gas, such as TEOS, can be supplied via MFC 11 from the TEOS supply unit 13 in the constant temperature tub 14.

In relation to this equipment, the silicon oxide film having a good quality can be formed by mixing small amounts of $O_2$ or $H_2O$ of 0.5% or below to $Si_2H_6$ and introducing the mixture, or introducing the $O_2$ or $H_2O$ from the upperstream of $Si_2H_6$ as the oxide gas to the reactor tube 1.

Further, in the case of introducing TEOS, TEOS may be mixed to the silane group gas and may be supplied after mixing to the oxide gas of oxygen and the like.

In this embodiment, when the supplied amount of TEOS was 30 sccm, a suitable fluidity was obtained.

Although there is no specific limit of the temperature of the reaction, it was found out that about 300°~1,000° C. was preferable in this embodiment.

When the forming silicon oxide film is used as the inter-insulating film having a large thickness, the silicon oxide film having a good quality can be formed at the high growth rate by keeping the temperature of the silicon wafer to 450° C. or thereabout.

In this embodiment, the silicon oxide film was formed on the silicon wafer 3 by using the batch type CVD silicon oxide film formation equipment as shown in FIG. 5, supplying 600 sccm of $H_2$, 300 sccm of $O_2$ and 30 sccm of disilane ($Si_2H_6$), and making the temperature of the silicon wafer 450° C. and the pressure 1 atmosphere.

With this configuration, the distribution of the temperature on the equal heat zone of the reactor tube 1 was ±1.

On the other hand, as the comparative example, the silicon oxide film was formed by supplying $Si_2H_6$ and the oxide gas ($O_2$) as the same as the above case.

Figure 6:
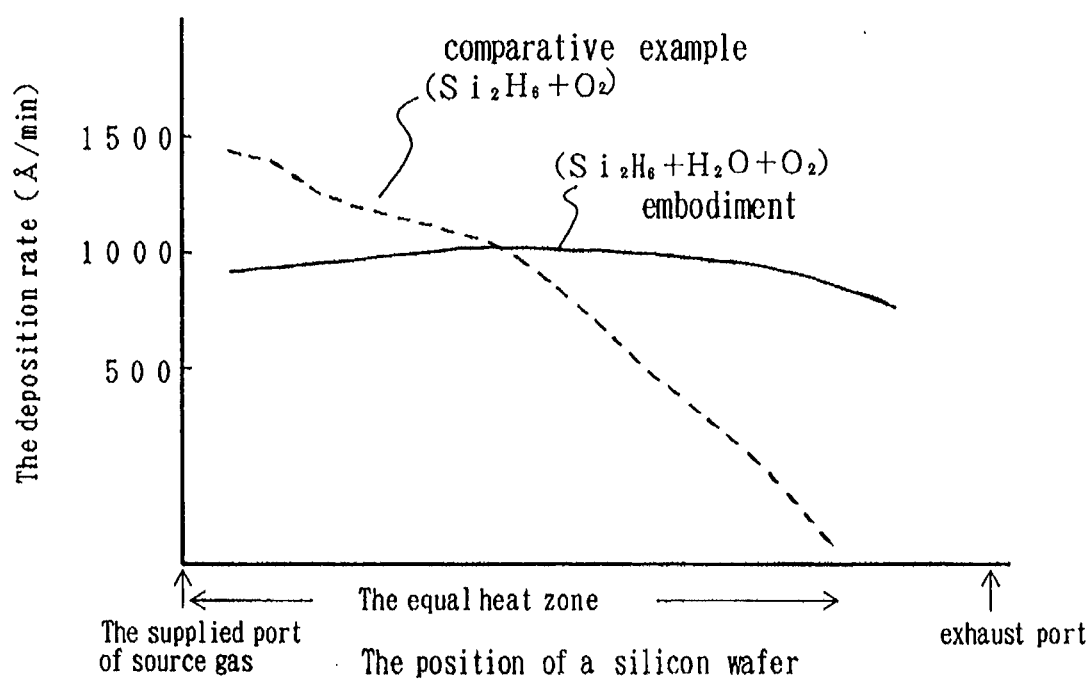
FIG. 6 is a chart showing the relationship between the position of a silicon wafer and the deposition rate in the first embodiment of the present invention.

FIG. 6 is a graphic chart showing the relation between the position of a silicon wafer and the deposition rate in the first embodiment of the present invention.

In this chart, the abscissa shows the position of wafer from the supplied port of the feed gas to the exhaust port and the ordinate shows the deposition rate.

In this embodiment, besides that the covering was suitable, it can be seen that the growth rate (the solid line) at the position from the supplied port of the feed gas to the exhaust port is improved remarkably in comparison with the deposition rate of the comparative example (the broken line) and the silicon oxide film having a nearly equal thickness on each silicon wafer can be formed, even if the batch processing is performed.

Although this chart shows the result of using disilane, it was found out that a very similar result as the case where the silane group gas was used, can be maintained. More particularly, it was found that the effectiveness of the improvement was even higher when trisilane was used instead of disilane.

The modes of some variations of this embodiment are described as follows;

1. Although water supply within the reactor tube is maintained by heating of hydrogen ($H_2$) and oxygen ($O_2$) in this embodiment, water can be supplied by using the process for bubbling pure water with the carrier gas directly.

2. Although the example for forming the silicon oxide film at the normal pressure is shown in this embodiment, the silicon oxide film may be formed by decompression CVD connecting an exhaust pump to the exhaust port to control the amount of flowing gas.

3. Although the vertical type reactor tube is used, as shown in FIG. 5 in this embodiment, a horizontal type reactor tube or the catapult process at a normal pressure may be used.

SECOND EMBODIMENT

Figure 7:
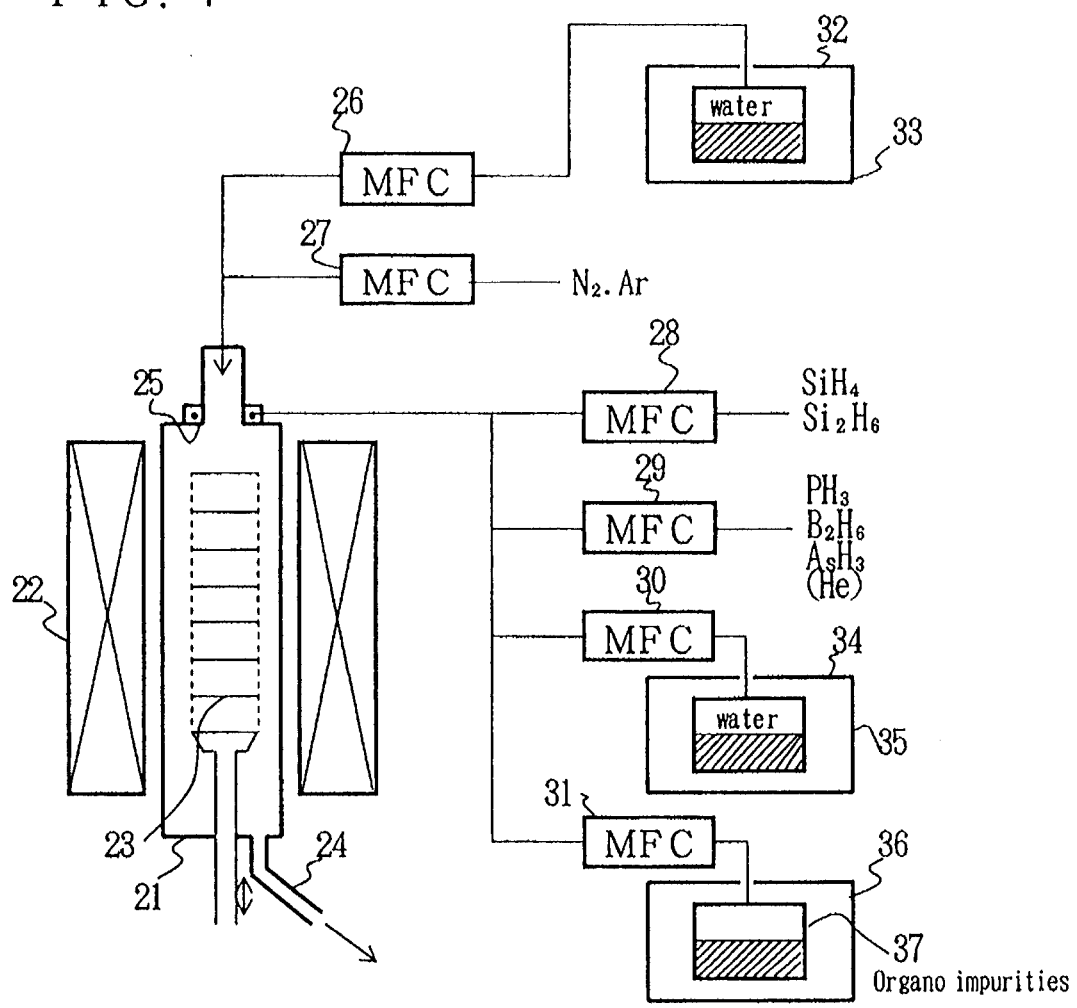
FIG. 7 is a structural diagram explaining an outline of batch type CVD silicon oxide film formation equipment used in a second embodiment of the present invention.

FIG. 7 is an explanatory diagram showing a structure of a concept of batch type CVD silicon oxide film formation equipment employed in a second embodiment.

In this diagram, 21 is a reactor tube, 22 is a heater, 23 is a silicon wafer, 24 is an exhaust port, 25 is a shower nozzle, 26, 27, 28, 29, 30 and 31 are mass flow controllers (MFC), 33 and 35 are water supply units, 37 is an organic impurities supply unit, and 32, 34 and 36 are constant temperature tubs.

Reactor tube 21 is provided with heater 22 therearound, and accommodates a plural silicon wafers 23 therein. Shower nozzle 25 and the exhaust port 24 are provided as shown. A more detailed explanation is omitted as this quartz reactor tube 21 is the same as one on the batch type silicon oxide film formation equipment of the first embodiment.

In this embodiment, water vapor produced from the water supply unit 33 which is accommodated to the constant temperature tub 32 is supplied to the upper section of the reactor tube 21 via the mass-flow controller (MFC) 26.

Although about 30 sccm of the silane group gas, such as $SiH_4$ and $Si_2H_6$, is supplied from the shower nozzle 25 via MFC 28, the inert-gas, such as nitrogen ($N_2$) and argon (Ar), is supplied into the reactor tube 21 via MFC 27 to prevent undesirable heating.

Further, in this example, impurity having a fluidity of $PH_3$, $B_2H_6$, $A_sH_3$ and the like which makes the forming silicon oxide film fluidity at the low temperature is supplied in the reactor tube 21 via MFC 29 with the carrier gas as required.

In the case as impurity having fluidity is introduced, not only it can be introduced independently but it may be mixed to the silane group gas or it may be mixed to hydrogen and the like.

When impurity having the fluidity of phosphine ($PH_3$), disilane ($B_2H_6$), arsinc ($A_sH_3$) and the like is appended into the feed gas, because of the deposition of the silicon oxide film on the state of fluidity, it is extremely favorable that not only the flatness of the silicon oxide film can be improved at the lower temperature than that maintained by reflowing according to the conventional process of annealing in water vapor, but also the deterioration of films is reduced.

That is, in the conventional case of reflowing by annealing in water vapor, it is unavoidable that phosphine oxide ($P_2O_5$) in the silicon oxide film, such as PSG, is flowed out and the path of flowing out is made porously. However, a fine silicon oxide film is formed because the flowing out of phosphine acid and the formation of silicon oxide film are performed at the same time in this embodiment.

In this step, as described above, not only the inorganic group gas, such as phosphine, diborane, and arsinc, can be used as impurity having fluidity, but also the organic group doping impurity gas, such as $P(CH_3)_3$, $B(CH_3)_3$, and $A_s(CH_3)_3$, can be used. In this case, the fluidity of the growing silicon oxide film becomes improved, and the flatness of the film can therefore be improved.

In this case, the silicon oxide film which has no fluidity but has a suitable quality and the silicon oxide film which has a slightly inferior quality but has fluidity are formed alternatively, and the intermediate quality silicon oxide film between both films is formed by supplying water intermittently to the silane group gas and the oxide gas or by supplying the impurity having the fluidity of said phosphine and the like intermittently.

THIRD EMBODIMENT

Figure 8:
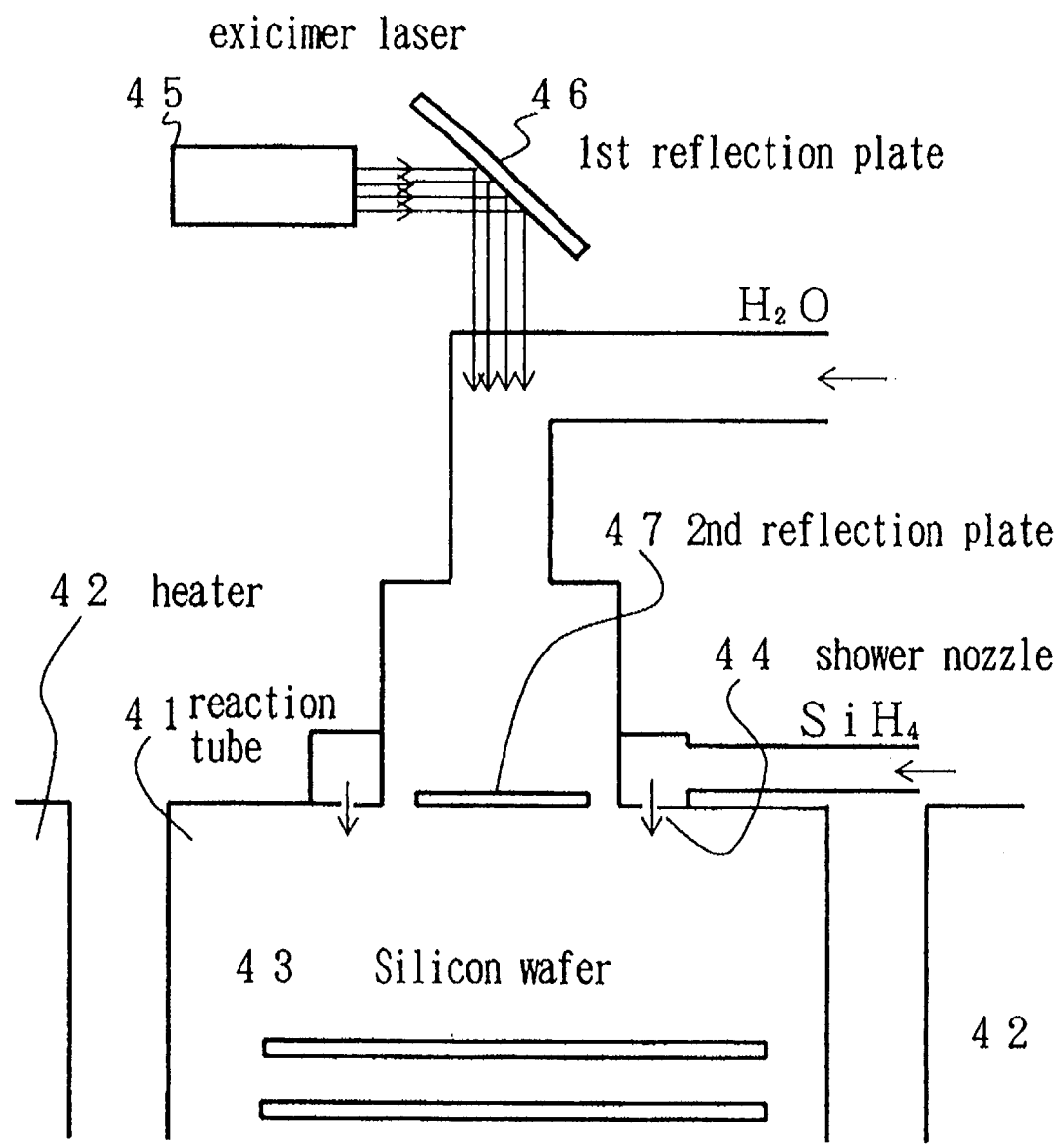
FIG. 8 is a structural diagram explaining an outline of batch type CVD silicon oxide film formation equipment used in a third embodiment of the present invention.

FIG. 8 is an explanatory diagram showing a structure of a concept of batch type CVD silicon oxide film formation equipment used in a third embodiment.

In this diagram, 41 is a reactor tube, 42 is a heater, 43 is a silicon wafer, 44 is a shower nozzle, 45 is an excimer laser, 46 is a first reflection plate and 47 is a second reflection plate.

Heater 42 is arranged around the quartz reactor tube 41, and the silicon wafer 43 accommodated in the reactor tube 41 is heated up at the suitable growth temperature. $H_2O$ is supplied from the upper of the reactor tube 41, and monosilane gas ($SiH_4$), a silicon group gas, is supplied via the shower nozzle 44.

$H_2O$ gas is excited by being incident for reflecting the ultraviolet ray radiated from the excimer laser 45 on the path for supplying $H_2O$ or monosilane gas ($SiH_4$) by the first reflection plate 46 and reflecting again by the second reflection plate 47.

In this way, not only the temperature at which the growth of the silicon oxide film may be formed can be lowered, but the flatness and the quality of the film can be also improved by exciting $H_2O$ or the monosilane gas by the light of ultraviolet ray and the like.

FOURTH EMBODIMENT

Figure 9:
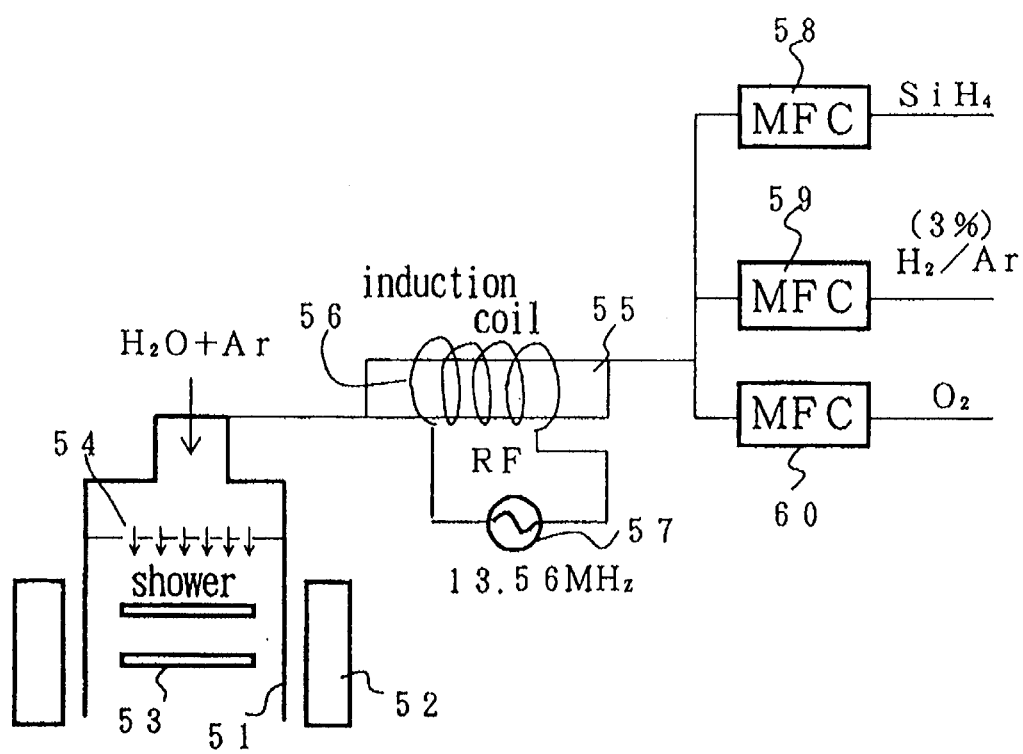
FIG. 9 is a structural diagram explaining an outline of batch type CVD silicon oxide film formation equipment used in a fourth embodiment of the present invention.

FIG. 9 is an explanatory diagram showing a structure of a concept of batch type CVD silicon oxide film formation equipment employing in a fourth embodiment.

In this diagram, 51 is a reactor tube, 52 is a heater, 53 is a silicon wafer, 54 is a shower nozzle, 55 is a plasma chamber, 56 is an induction coil, 57 is a high-frequency electric power and 58, 59 and 60 are mass flow controllers (MFC).

Heater 52 is arranged around the reactor tube 51 and the silicon wafer 53 accommodated in the reactor tube 51 is heated up. The monosilane gas via MFC 58, the Ar carrier gas mixed $H_2$ (3%) via MFC 59 and $O_2$ gas via MFC 60 are supplied from the shower nozzle 54 to the reactor tube 51.

Plasma chamber 55 is provided on the path of compound gas, the high-frequency electric power is supplied from the high-frequency electric power supply 57 to the induction coil 56 arranged around that chamber, and the compound gas are plasma discharged and activated.

By plasma discharging and activating at least one material selected from the silane group gas which is the feed gas, the organic silane gas or $H_2$, $O_2$ or water by using the microwave or the electric field of direct current besides the high-frequency electric field, the growing silicon oxide film is precisely and flatly generated.

Plasma discharging of the feed gas, the oxide gas and the like in this embodiment can be performed within the reactor tube as shown in the fifth embodiment, as discussed below, and plasma discharging can be performed in a single wafer type CVD silicon oxide film formation equipment in the same manner as in the reactor tube.

FIFTH EMBODIMENT

Figure 10:
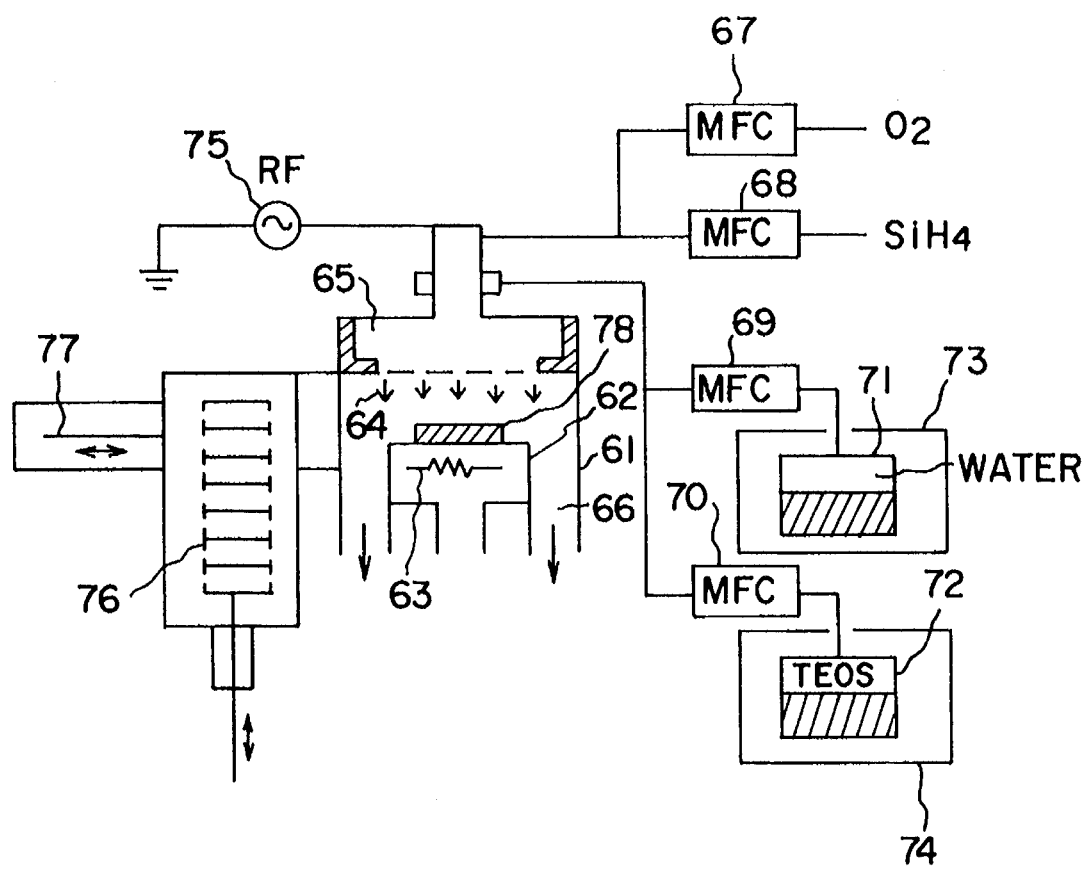
FIG. 10 is a structural diagram explaining an outline of single wafer type CVD silicon oxide film formation equipment used in a fifth embodiment of the present invention.

FIG. 10 is an explanatory diagram showing a structure of a concept of single wafer type CVD silicon oxide film formation equipment employed in the fifth embodiment.

In this embodiment, 61 is a reaction chamber, 62 is a susceptor, 63 is a heater, 64 is a shower nozzle, 65 is a source gas chamber, 66 is an exhaust port, 67, 68, 69 and 70 are mass-flow controllers (MFC), 71 is a water supply unit, 72 is a TEOS supply unit, 73 and 74 are constant-temperature tubs, 75 is a high-frequency electric power supply, 76 is a wafer cassette, 77 is a wafer transfer unit and 78 is a silicon wafer.

Susceptor (the rack for placing the silicon wafer substrate) 62 provided with the heater 63 is located within the reaction chamber 61, and the silicon wafer 78 is placed on this susceptor 62. Monosilane ($SiH_4$), used as the silicon feed gas, is supplied via the mass-flow controller (MFC) 68 or TEOS which is an organic silane gas is supplied via MFC 70 from the TEOS supply unit 72 within the constant-temperature tub 74 to the feed gas (source gas) chamber 65 insulated from the circumference. It is furthermore composed that oxygen ($O_2$) used as the oxide gas is supplied via MFC 67, or water vapor ($H_2O$) is supplied via MFC 69 from the water supply unit 71 within the constant-temperature tub 73 to the source gas chamber 65.

In the case of this embodiment, 20 sccm of water, 10 sccm of monosilane and about 1 sccm of oxygen ($O_2$) were supplied.

By mixing the feed gas supplied within the source gas chamber 65 here, and spraying the gas toward the silicon wafer 78 from the shower nozzle 64, the silicon oxide film is formed. The silicon wafer 78 at that time is heated up to the extent of 350° C. and the atmosphere pressure is controlled at the extent of 0.1~30 Torr.

Further, the reaction chamber 61 is configured to be able to exhaust via the exhaust port 66 and the silicon wafer 78 is transferred sheet by sheet in order from the wafer cassette 76 on the susceptor 62 by the wafer transfer unit (the carrier) 77.

The fineness and flatness of the silicon oxide film can be realized by supplying the high-frequency electric power from the high-frequency electric power supply 75 between the shower nozzle 64 and the ground to plasma discharge and activate the feed gas.

Furthermore, the high-frequency electric power supply 75 is directly connected between the shower nozzle 64 and the ground in this diagram. However, the power supply 75 may be applied on the side of the susceptor 62 to control plasma discharging of the feed gas by adjusting the bias voltage supplied from the high frequency electric power supply so that the desired fineness and flatness of the silicon oxide film can be also realized.

In the above-example, although the high-frequency electric power of 13.56 MHz is used as the electric power supply which causes the plasma discharge of the feed gas, the micro wave, the low frequency of about 10 kHz, or the direct current can be also used, and further, the exciting electric power having multiple frequencies can be introduced.

Further, it was found out to improve a covering and a flatness of the silicon oxide film when the exciting electric power was applied intermittently and the plasma discharge of the feed gas was caused.

Because the silicon oxide film is formed to have stratified formation regularly by repeating that the adsorption for the foundation of water and disilane is speeded up with the plasma "OFF", and that the oxidized reaction of water and disilane adsorbed in the previous step is speeded up with the plasma "ON".

Further, by switching the supplement of TEOS on or off at the period which is sufficiently longer than the pulse time period of the exciting electric power, flattening by the fluidization and the growth of the silicon oxide film are repeated, so that the flatness of the silicon oxide film can be further improved.

Figure 11:
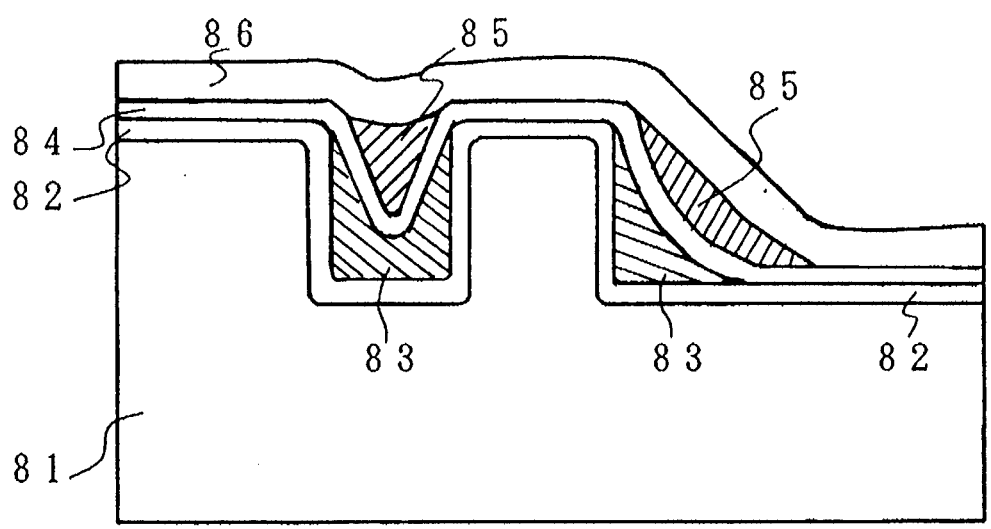
FIG. 11 is a typical diagram showing a structure of a multi-layer silicon oxide film formed according to the fifth embodiment of the present invention.

FIG. 11 is a typical diagram showing a structure of a multi-layered silicon oxide film formed according to the fifth embodiment.

In this diagram, 81 is a substrate, 82 is a first layer, 83 is a second layer, 84 is a third layer, 85 is a fourth layer and 86 is a fifth layer.

In this example, as shown in FIG. 11, a first layer 82 is formed by supplying the compound gas of monosilane (SiH$_4$), water vapor (H$_2$O) and oxygen (O$_2$) on the substrate 81 having the an uneven surface (this is the formation of a conformal silicon oxide film) and a second layer 83 is formed by introducing the compound gas of monosilane (SiH$_4$), water vapor (H$_2$O), oxygen (O$_2$2) and TEOS (20 sccm) on the first layer (this is the formation of the silicon oxide film which has suitable fluidization). Then, a third layer 84 is formed by stopping the supply of TEOS on the second layer and supplying the compound gas of monosilane (SiH$_4$) and oxygen (O$_2$) (this is the formation of the fine silicon oxide film), a fourth layer 85 is formed by introducing TEOS again on the third layer (flattened), and a fifth layer 86 is formed by stopping the supply of TEOS on the fourth layer and introducing the compound gas of monosilane (SiH$_4$), water vapor (H$_2$SO) and oxygen (O$_2$) (this is the formation of a conformal silicon oxide film).

By forming layers described above, the silicon oxide film having a slightly inferior quality at the time for appending the TEOS can be covered with the fine silicon oxide film at the time for using feed gas that does not include TEOS, so that the inter-insulating film having a flatness and a good quality can be improved as a result thereof.

Further, by pouring the silicon of the silane group gas in the reaction of TEOS+water group, the dehydration reaction from TEOS is promoted and oxidized itself, so that the quality of the film can be further improved and the deposition rate is increased.

The film formed by the silane+water+TEOS group oxidization is of a higher quality than the conventional oxide film formed by water+TEOS, especially with regard to the quality of film and the deposition rate.

The process for appending the organic silane to water+the silane group oxidization is divided into two separate cases. Those are, one case for appending TEOS of the extent of 20 sccm as described above and another case for suppressing at the extent of 10% of the amount of silane, i.e., 3 sccm.

In the case for appending the infinitesimal organic silane, the perfect covering can be realized by making the surface migration of the deposition element higher.

It was not found that the quality of the film becomes inferior when this amount of TEOS was appended.

SIXTH EMBODIMENT

Figure 12:
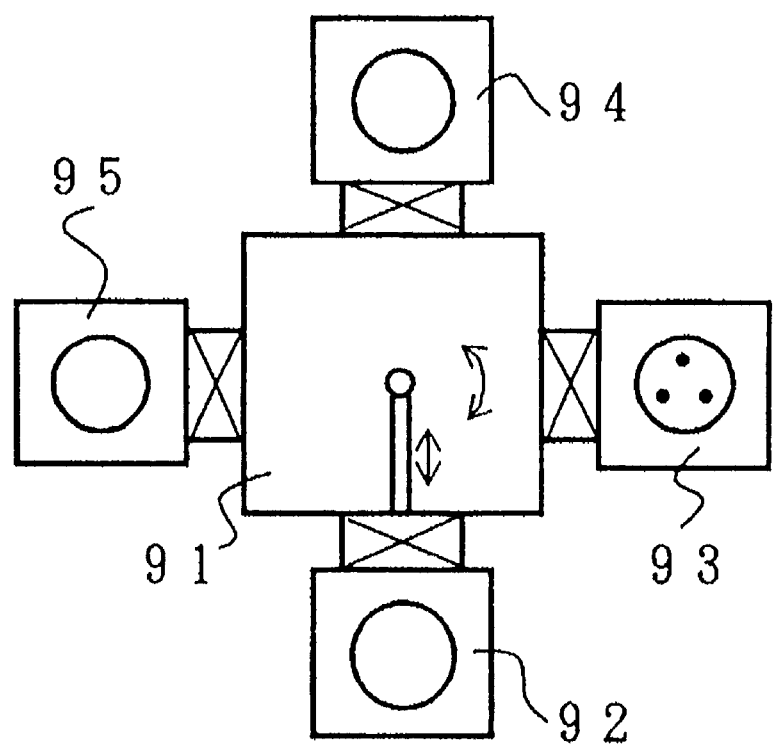
FIG. 12 is a structural diagram explaining an outline of multi chamber type CVD silicon oxide film formation equipment of a sixth embodiment of the present invention.

FIG. 12 is an explanatory diagram showing a structure of a concept of a multi chamber type CVD silicon oxide film formation equipment of a sixth embodiment.

In this diagram, 91 is a carrier chamber, 92 is a load-lock, 93 is a lamp annealing chamber, 94 is an oxide film deposition chamber and 95 is an etching chamber.

Lamp annealing chamber 93, the oxide film deposition chamber 94 and the etching chamber 95 for the spatter, RIE and the like are connected around the carrier chamber 91 and sealed from the outside air.

Then, the silicon wafer introduced from the load-lock 92 is put into the lamp annealing chamber 93.

After outgassing the silicon wafer, the surface of metal of the Al wirings and the like is oxidized at about 1~100 Torr by introducing oxygen.

After that, the silicon wafer is transported to the oxide film deposition chamber 94 via the carrier chamber 91, and the CVD deposition of the silicon oxide film according to the present invention described above is performed.

The silicon wafer is then transported to the etching chamber 95 and the oxide film deposited in the previous step is flattened by an Ar spattering.

In this case, the silicon oxide film employing TEOS is not only flattened for a short time because the etching rate is larger, but the quality of the film is also improved remarkably on this process and the CVD silicon oxide film of the surface has the same quality as the heat oxide film.

Further, by repeating the operation of the deposition of this silicon oxide film and the etching, the silicon oxide film could be more flattened and then the multiple-layered silicon oxide film having a good quality could be formed.

SEVENTH EMBODIMENT

Figure 13A:
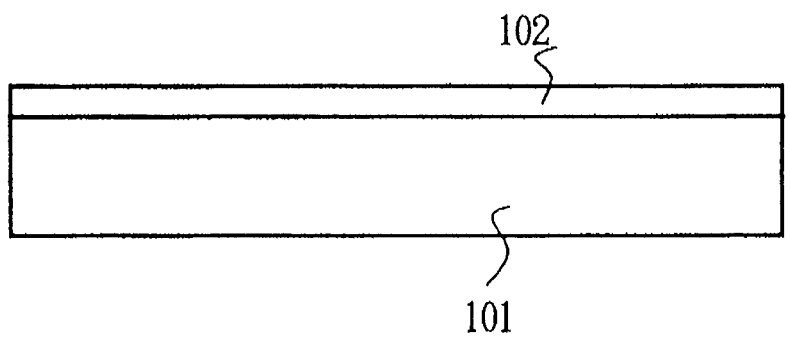
FIGS. 13A through 13C are diagrams explaining the steps in a case where a Si wafer is adhered on the Si substrate of the seventh embodiment of the present invention.
Figure 13B:
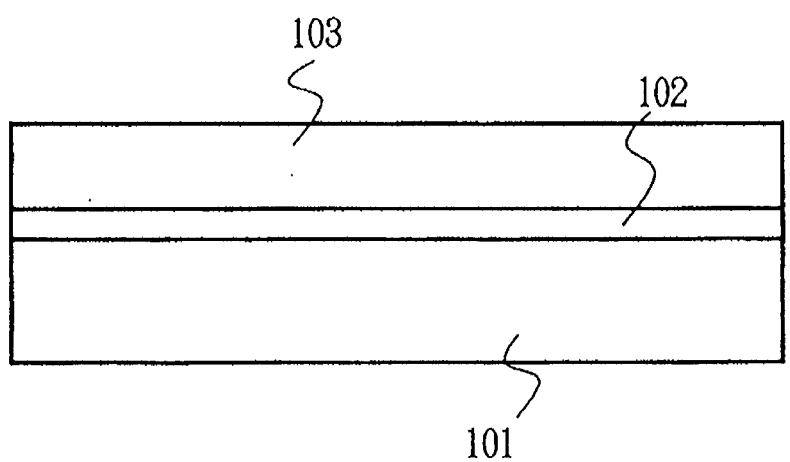
Figure 13C:
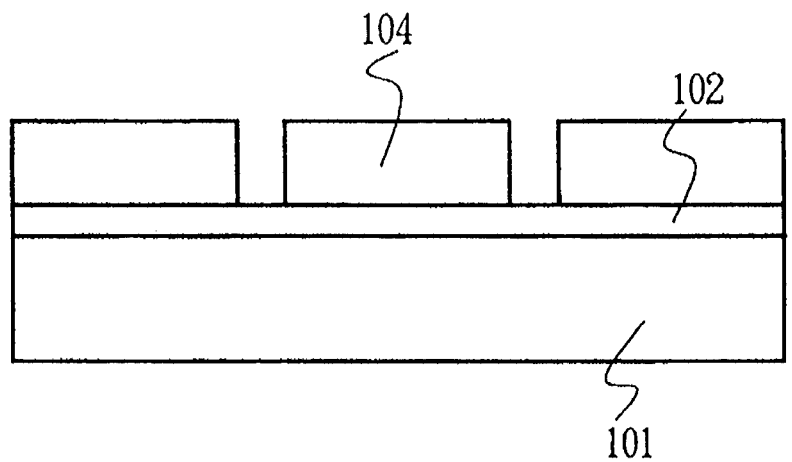

FIGS. 13A through 13C are explanatory diagrams of the step in the case where a Si wafer is adhered on the Si substrate of the seventh embodiment.

In this diagram, 101 is a Si substrate, 102 is a PSG layer, 103 is a Si wafer and 104 is a chip.

FIRST STEP (Referring to FIG. 13A)

The PSG layer 102 is formed by the CVD process for using water and silane as the reaction gas on the substrate 101.

SECOND STEP (Referring to FIG. 13B)

The Si wafer 103 is adhered by dissolving the PSG layer 102 formed according to the first step.

THIRD STEP (Referring to FIG. 13C)

The multiple chips 104 are made by dividing the Si wafer adhered by the PSG layer 102 on the Si substrate 101 as required with etching.

As the phosphorus concentration in the film becomes 7% or below when said PSG layer 102 is formed by being the temperature of the substrate 400°~600° C. and supplying plasma, the dissolution temperature when the Si wafer is adhered becomes 800° C. or above.

Further, in the case for adhering by employing PSG formed at 200°~400° C., it is dissolved at 800° C. or below, i.e., about 600° C. This is because the phosphorus concentration can be risen according to a PH$_3$ flow rate. It can improve easily even at 10% or above and dissolve at the low temperature.

Although this is because the phosphorus concentration is taken excessively, the condition for forming the film, for example, pressure of the reaction gas, pressure of H$_2$O, RF electric power and the like, which can form the PSG layer having the desired temperature of dissolution, according to FIG. 2 as the above-explained can be decided. Although the phosphorus concentration taken at the growth temperature is decided, the PH$_3$ gas has to be supplied more so as to reach to the upper limit of the concentration, as shown in the chart 1.

In this example, although the chip is made by dividing after adhering the Si wafer, the chip can be adhered directly.

EIGHTH EMBODIMENT

It was found out that the SiO$_2$ film formed by the low-temperature CVD process for plasma exciting water+SiH$_4$ has the better quality than the SiO$_2$ film formed by the conventional CVD process and has the better quality than the best thermally oxidized SiO$_2$ film obtained as before.

Figure 14A:
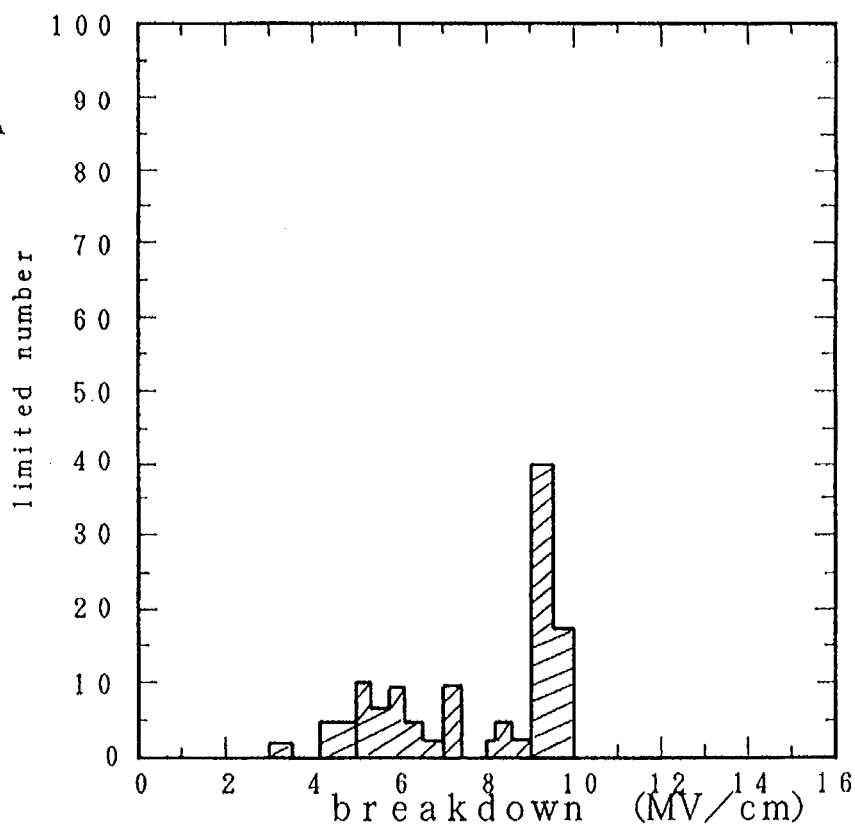
FIGS. 14A through 14B are diagrams showing the characteristic of breakdown of a $SiO_2$ film according to an eighth embodiment of the present invention.
Figure 14B:
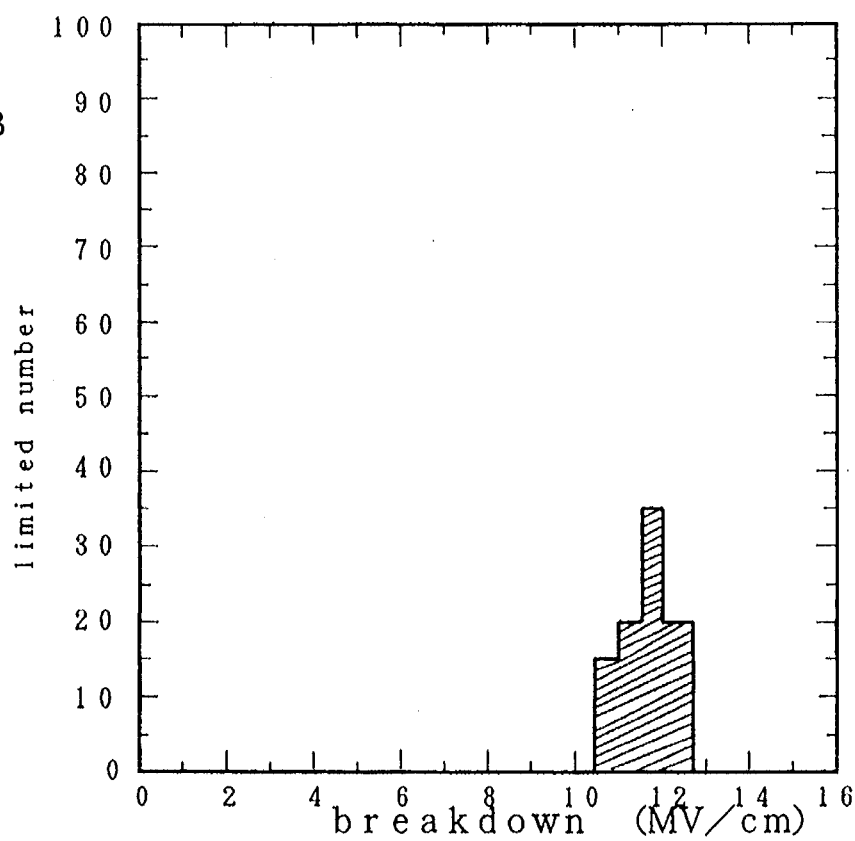

FIGS. 14A and 14B are specific diagrams of breakdown characteristics of a $SiO_2$ film of an eighth embodiment.

The abscissa in these diagrams show the breakdown value and the ordinate shows the number of samples having each breakdown value by percentage.

FIG. 14A shows the breakdown value of the $SiO_2$ film formed by the thermal CVD and the peak of the limited number occurs at 8.08 MV/cm. In contrast to FIG. 14A, FIG. 14B shows the breakdown value of the $SiO_2$ film formed by the low-temperature CVD process for plasma exciting water+$SiH_4$ and the peak of the limited number occurs at 11.9 MV/cm. As is apparent from those diagrams, it is improved remarkably.

The sample shown in FIG. 14B, is one formed the $SiO_2$ film at 3 Torr of the gas pressure in the equipment shown in FIG. 10 by supplying 2.5 sccm of monosilane ($SiH_4$) and 100 sccm of $H_2O$ from the shower 64, and applying RF 100 W and making the substrate at 420° C. This is the unexpected result as before.

Such a $SiO_2$ film having higher breakdown characteristic is the $SiO_2$ film grown at the ratio of $SiH_4$:$H_2O$=1:10 or below at 200°~600° C. of the temperature of the substrate and 0.1~20 Torr of the pressure. In this embodiment, the plasma power of 50 W or above is required. $O_2$ and TEOS are not used here.

Further, the breakdown value is improved more and the reliability is also improved when the annealing is performed at 800° C. or above.

To maintain the film having a high breakdown value and a high reliability, it is the minimum requirements to apply the plasma by the feed gas of $H_2O$ and $SiH_4$, and it is important to grow the film at the low-temperature. There is no lowering of the breakdown value on the uneven formation because of the high quality covering of this film.

$SiO_2$ film having a good quality which can be formed at the low-temperature can be used to the gate insulating film, the dielectric of the capacitor of the MOS transistor and the like.

Figure 15A:
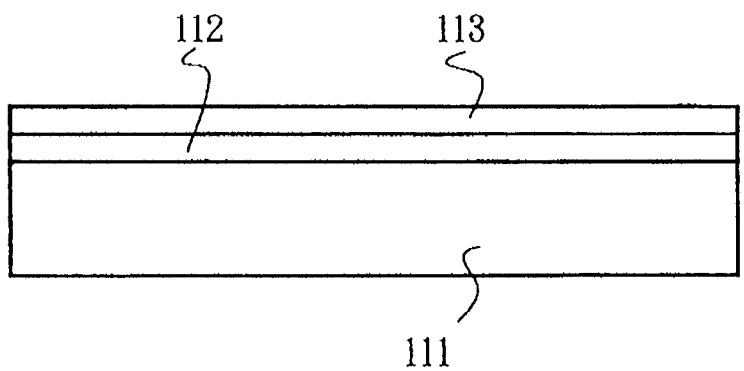
FIGS. 15A–C is a diagram showing the steps for producing a thin-film transistor by a process for forming a $SiO_2$ film according to the eighth embodiment of the present invention.
Figure 15B:
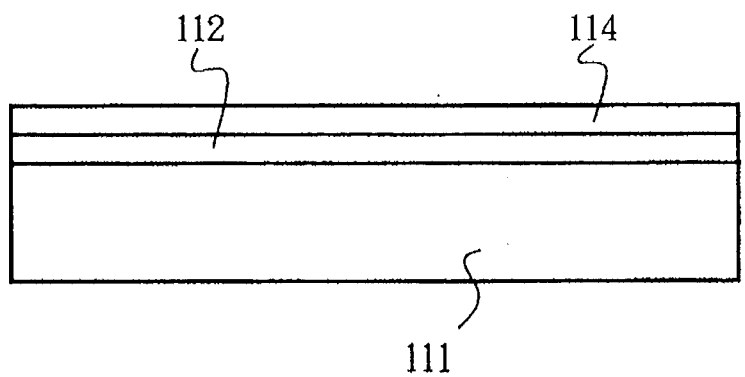
Figure 15C:
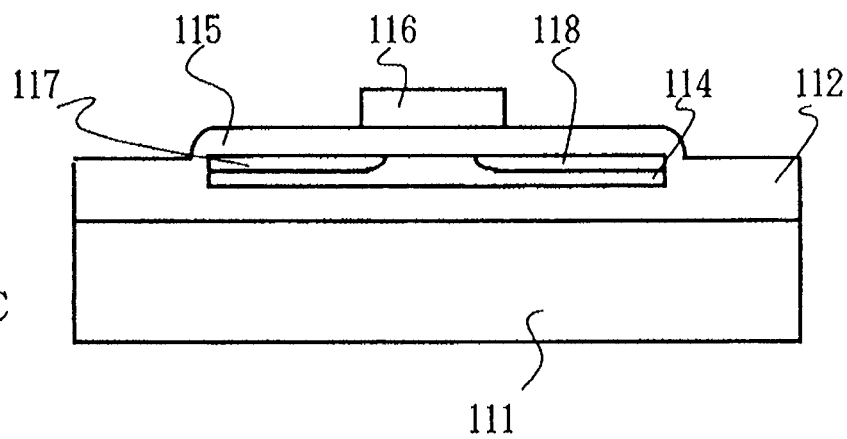

FIGS. 15A through 15C are diagrams of a step for producing a thin-film transistor embodying a $SiO_2$ film formation process of the eighth embodiment.

In this diagram, 111 is a silicon substrate, 112 is a $SiO_2$ film, 113 is an amorphous silicon film, 114 is a polysilicon film, 115 is a gate insulating film, 116 is a gate electrode, 117 is a source area and 118 is a drain area.

The process for producing the eighth embodiment is explained according to the diagram for explaining these steps as follows;

FIRST STEP (Referring to FIG. 15A)

The $SiO_2$ film 112 is formed on the silicon substrate 111 and the amorphous silicon film 113 having a thickness of 500 nm is formed on the film 112 by the CVD process.

SECOND STEP (Referring to FIG. 15B)

The polysilicon film 114 is formed by performing annealing of about 600° C. and crystallizing the amorphous silicon film 113.

THIRD STEP (Referring to FIG. 15C)

The gate insulating film 115 having a thickness of 30 nm is formed under the plasma CVD process by supplying water+$SiH_4$ and keeping the temperature of the substrate at 400° C. after removing the polysilicon film 114 of the outside which is not used as the transistor.

After that, the gate electrode 116 is formed by depositing and patterning the polysilicon film having a thickness of 300 nm.

The thin-film transistor (TFT) is formed by using this gate electrode 116 as a mask and injecting $A_s$ ions to form the source area 117 and the drain area 118.

NINTH EMBODIMENT

Figure 16A:
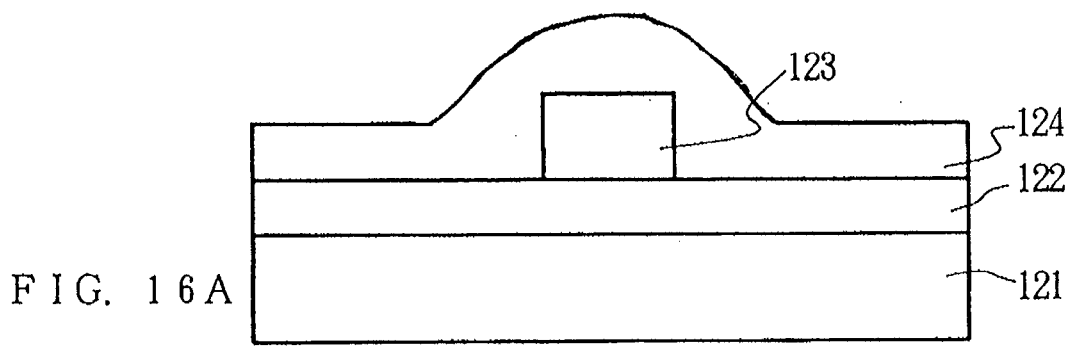
FIGS. 16A through 16C are diagrams explaining the process for forming an insulating film by first producing an inorganic silanol then forming a silicon oxide film.
Figure 16B:
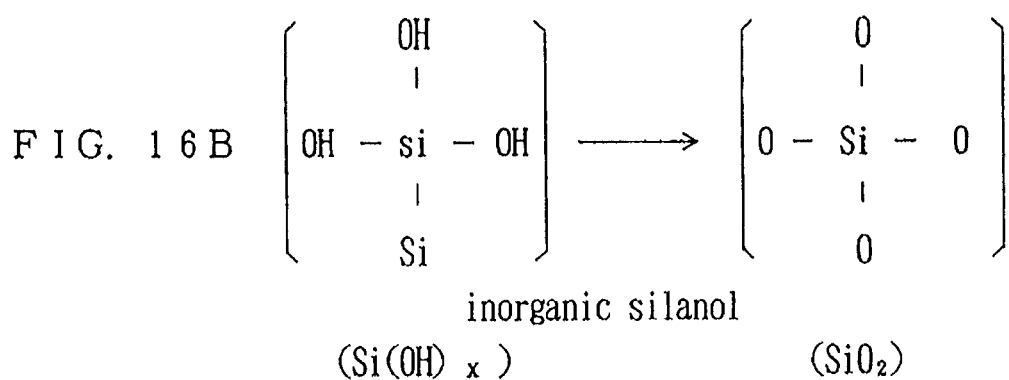
Figure 16C:
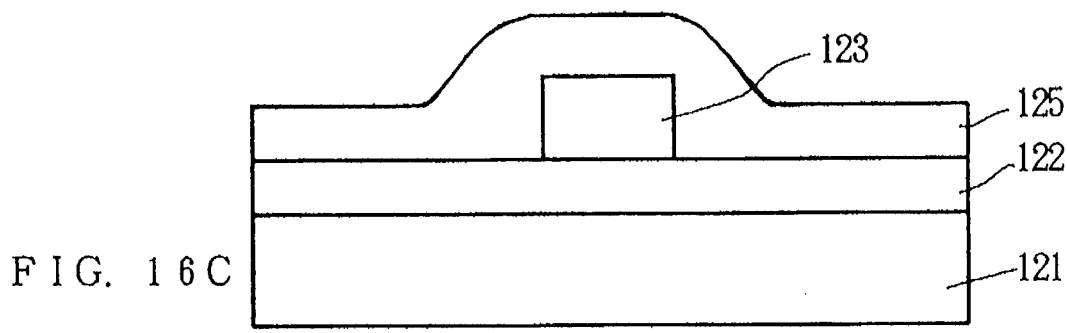

FIGS. 16A through 16C are diagrams explaining a process for forming of the insulating film, wherein an inorganic silanol is generated according to the present invention. It is then transformed to the silicon oxide film. Further, FIGS. 16A and 16C are cross sections of the step for forming the insulating film and FIG. 16B is a structural formula of an inorganic silanol generated in the embodiment of the present invention.

In this diagram, 121 is a semiconductor substrate, 122 is an oxide film, 123 is an aluminum wiring and 124 is an inorganic silanol.

As shown in FIG. 16A, when moisture and $SiH_4$ are excited by the plasma of low-power explained in relation to FIGS. 3 and 4, an inorganic silanol 124 having a good flatness is formed. Then, the perfect silicon oxide film 125 is formed as shown in FIG. 16C by heating or exposing the inorganic silanol 124 to the oxygen plasma, according to the chemical transformation, as shown in FIG. 16B.

Further, a nitride film is also formed by performing an ammonia plasma process on the state of silanol. As shown in FIG. 16C, this is the fine or minute film having a good covering.

Figure 17:
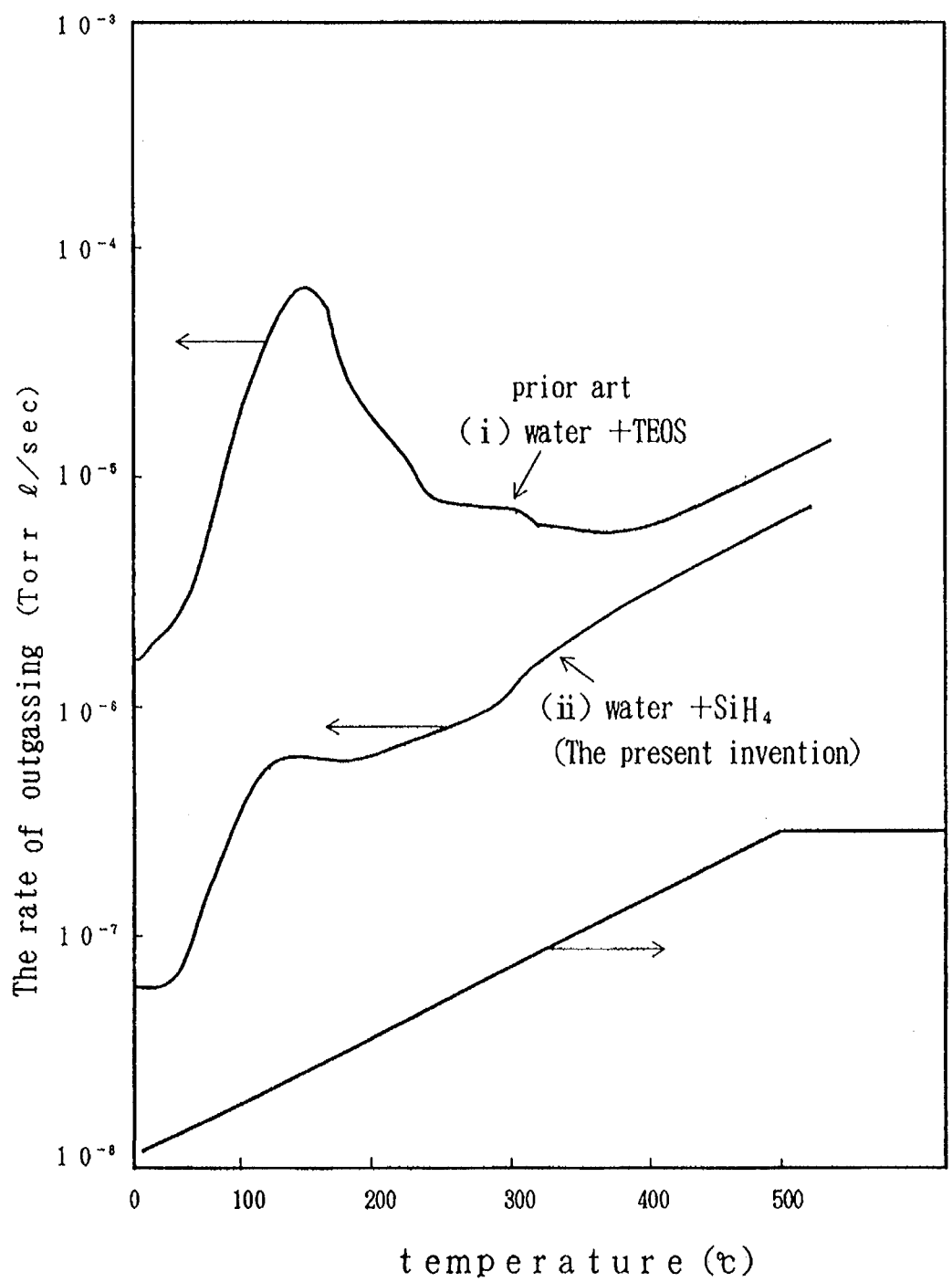
FIG. 17 is a diagram showing the relationship of the outgassing rates of the insulating film of the present invention and the conventional insulating film.

FIG. 17 is a diagram showing the relation of the rate of outgassing between the insulating film of the present invention and the conventional insulating film.

The film (i) having a flatness generated by using an organic group gas such as is described in Japanese unexamined patent application No. 4-111424 generates much more outgassing, as shown in this diagram. In contrast, the film (ii) having a flatness of the present invention formed from water and $SiH_4$ generates a small amount of outgassing of 1/100 or below. The difference between the one and the other on oxidation by the means of using the same water is caused by whether the source gas is an organic group or it is an inorganic group.

Figure 18:
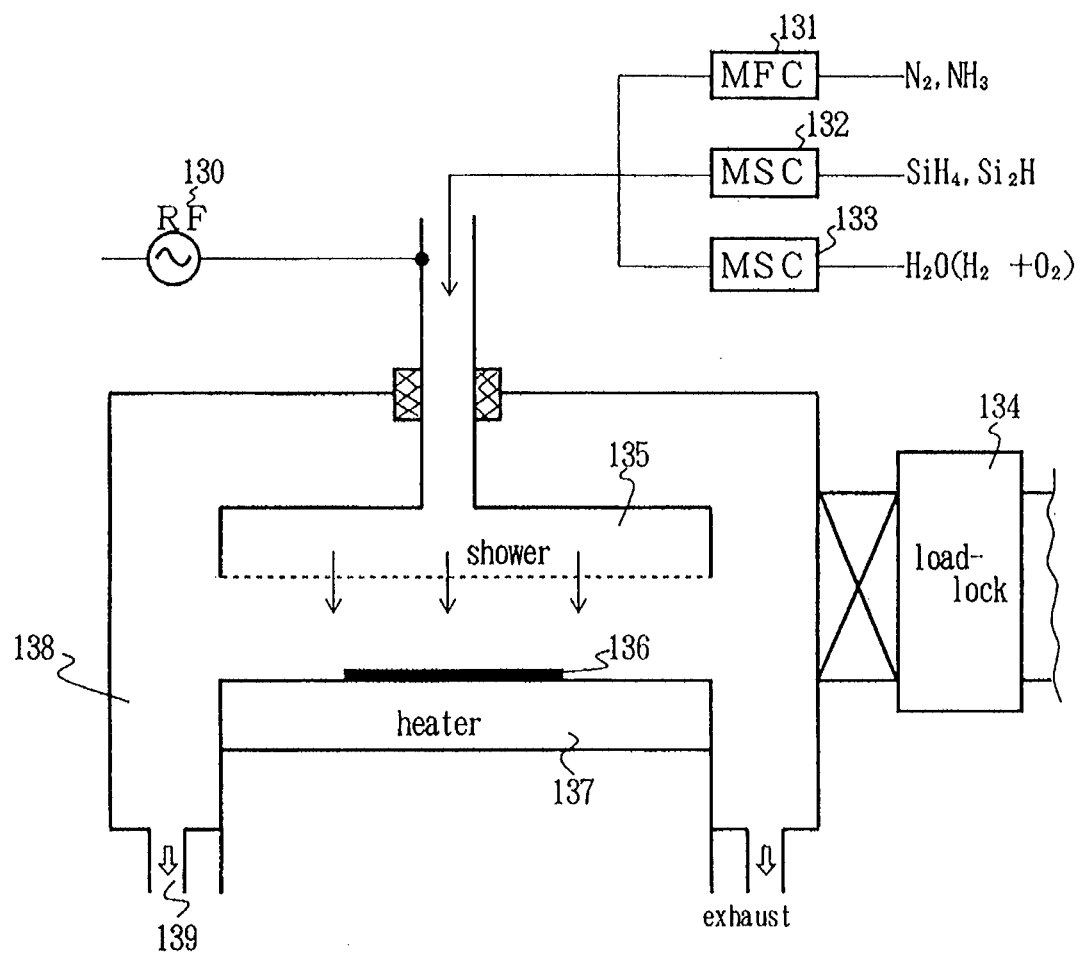
FIG. 18 is a structural diagram showing an outline of single wafer type CVD equipment employed in a ninth embodiment.

FIG. 18 is a structural diagram showing an outline of a single wafer type CVD equipment employing in the ninth embodiment. In the diagram, 130 is a high-frequency oscillator, 131 through 133 are mass-flow controllers (MFC), 134 is a load-lock chamber, 135 is a shower nozzle, 136 is a silicon wafer, 137 is a heater and 138 is a reaction chamber.

A susceptor (not shown in the diagram) is provided on a heater 137 within the reaction chamber 138. Silicon wafer 136 is placed on this susceptor, monosilane ($SiH_4$) is supplied as the silicon feed gas via the mass-flow controller (MFC) 132, and water vapor ($H_2O$) is supplied from the water supply unit to the reaction chamber 138 via a MFC 133.

In this embodiment, 100 sccm of water, and about 15 sccm of silane were supplied. The rate of silane or disilane to water affects the quality of deposited film. When the silane group is increased, silanol can easily form and it closes to $SiO_2$ when the rate of silane to water is reduced. The rate of about 2 to 20 of water and silane is suitable.

Then, the feed gas is sprayed toward the silicon wafer 136 from the shower nozzle 135 and the silicon oxide film mainly composed of inorganic silanol is formed. The silicon wafer 136 is then heated up at about 300° C. and oxygen pressure is controlled at about 0.1 to 30 Torr.

Further, the reaction chamber 138 is constituted so as to be able to exhaust via the exhaust port 139 and the silicon wafer 136 is transported from the load-lock chamber 134 onto the susceptor.

Further, the high frequency electric power is supplied between the shower nozzle 135 and ground from the high frequency electric power supply 130 and thus the feed gas is excited to cause the plasma. Accordingly, the flatness of the film can be improved by depositing silanol or SiH radical.

With this situation, it is important that the relation between the plasma power and the temperature as the above-explained in relation to FIGS. 3 and 4 becomes 20 (W·°C./cm$^2$) or below.

Further, in this diagram, the high-frequency electric power supply 130 is directly connected between the shower nozzle 135 and ground. The introduction of high-frequency electric power is performed from the side of the heater 137, the bias voltage is applied to it and plasma discharging of the feed gas is controlled by controlling the bias voltage, so that it can improve to have the suitable fineness and flatness of the deposited insulating film.

In the above example, the high-frequency electric power supply of 13.56 MHz high frequency electric power was used to cause the plasma of the feed gas. Microwaves, low frequency power of about 10 kHz, or direct current may be also used, in addition to other power sources. Further, the exciting electric power having multiple frequencies can be introduced. It was determined that covering and flatness of the silicon oxide film can be improved when the exciting electric power was applied intermittently and the plasma of the feed gas was caused.

This is considered because silicon oxide film is formed to have stratified formation regularly by repeating that the adsorption for the foundation of water and silane is speeded up when the plasma is OFF and that the oxidized reaction of water and silane adsorbed in the previous step is speeded up when the plasma is ON.

It is also possible to repeat the above-described cycle many times. Then, in this embodiment, although gasified water is introduced from MFC 133, water may be formed from hydrogen and oxygen on the reaction chamber.

Figure 19:
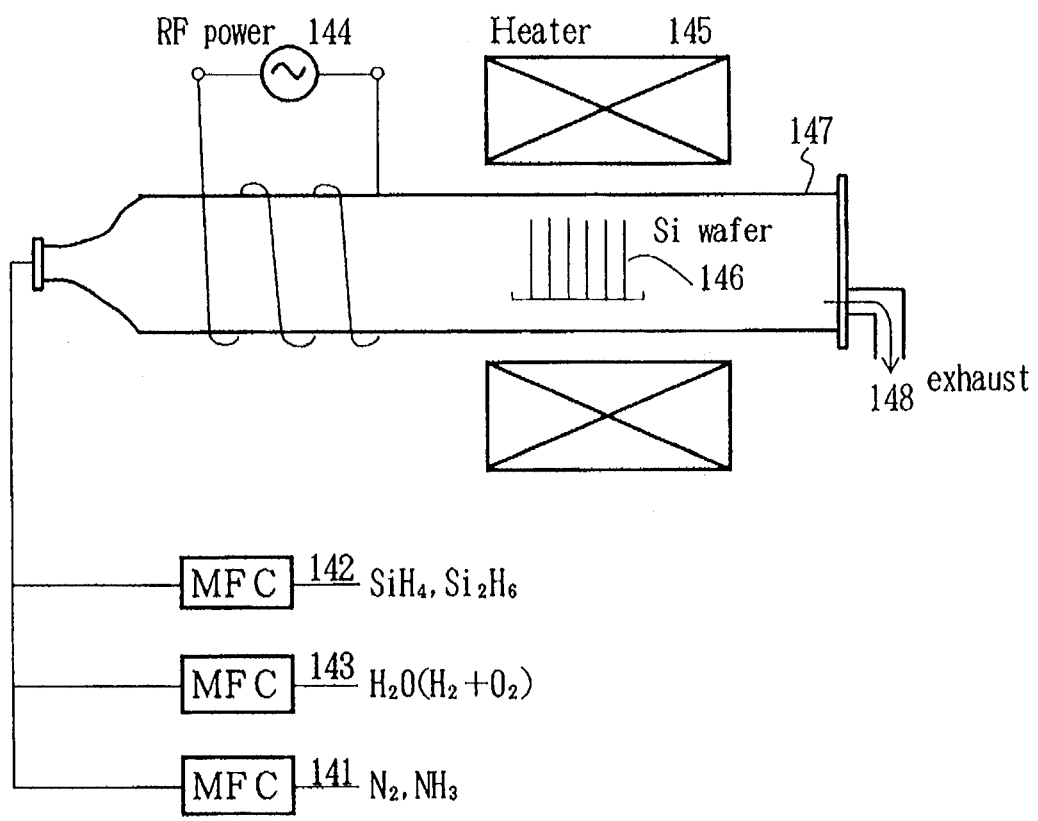
FIG. 19 is a structural diagram showing an outline of batch type CVD equipment instead of the single wafer type CVD equipment in FIG. 18.

FIG. 19 is an explanatory diagram in the case for using a batch type CVD equipment instead of a single wafer type CVD equipment as above-described in FIG. 18. In the diagram, 141 through 143 correspond to the mass-flow controllers (MFC) 131 through 133. Accordingly, gas is supplied in the same way.

144 is a high-frequency oscillator having an inductive coupling coil. 145 is an electric-furnace heater, 146 is a silicon wafer, 147 is a reaction chamber and 148 is an exhaust port. It is a different point between the case for using the batch type CVD equipment and the case for using the single wafer type CVD equipment that the exciting of plasma is performed on the place distance from the wafer.

Further, as it is a batch type CVD equipment, throughput is also improved. Although the flatness in this type is better because this system forms the inorganic silanol more easily than the single wafer type system in FIG. 18, the quality of the film in this type is inferior than the single wafer type. To cover up the faults, the anneal plasma radical process which is performed at a later step becomes important.

It is required that the relationship between the power and the temperature is 40 (W·°C./cm$^2$) or below, as explained with respect to FIG. 18. Further, in the case for processing by the equipment in FIG. 19, it is more effective to apply the microwave perpendicularly to the direction for supplying of gas.

In the ninth embodiment, a perfect insulating film is formed either by annealing a flattened and generated silanol at 400° C. or above, or by performing plasma irradiation to the silanol in nitrogen atmosphere or oxygen atmosphere.

As the inorganic silanol has a fluidity, but it includes a number of OH-group, Si-group and the like, it is required to process later and remove them. These become moisture and are emitted when these are plasma processed in atmosphere of oxygen, nitrogen and so on. More particularly, it also becomes clear to form a nitride film, when they are performed in an atmosphere including nitrogen of ammonia and the like. In this case, the temperature as low as the extent of 200° C. can be used for the formation of the film.

Further, it was determined that the hygroscopicity is improved by appending nitrogen, in the case where the oxide film is formed by water and the silane group gas. In this case, it was also determined that the nitride silicon film is formed while reducing the amount of water. As was apparent from this, this film is not only reduced by the degree of outgassing, but also is not permeable by moisture. When the ratio of the constituent parts of nitrogen to water is increased, the amount of nitrogen in the oxide film is increased and the nitride film is formed.

TENTH EMBODIMENT

Figure 20A:
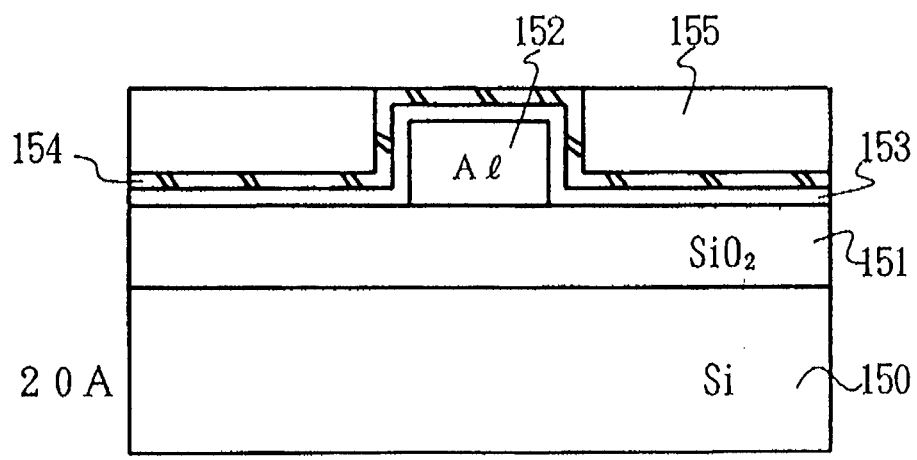
FIGS. 20A through 20B are diagrams explaining a structure of the cross section of the composite film of an oxide film and a nitrogen film (a nitride doped film) formed according to the process of the present invention by using the equipment of the ninth embodiment.
Figure 20B:
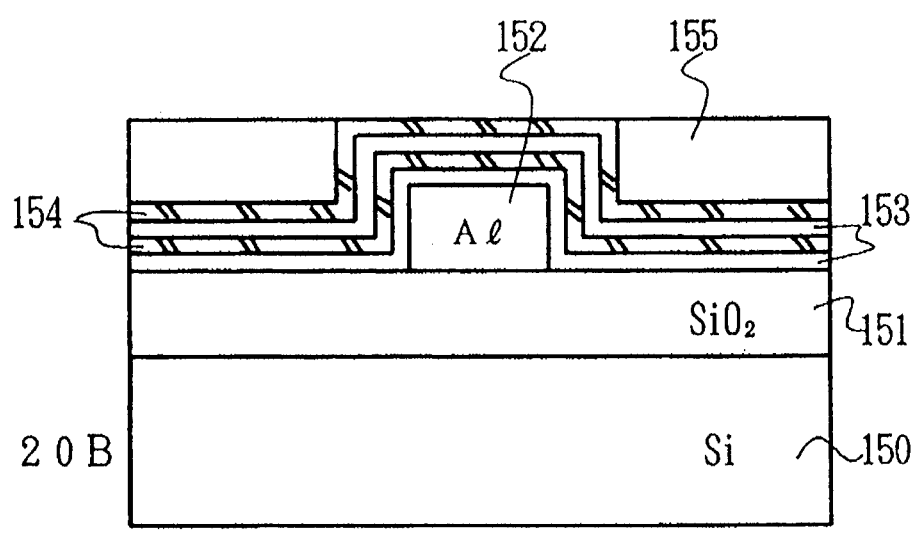

FIGS. 20A and 20B are diagrams explaining a structure of cross sections and the process of the film composed of the oxide film and the nitride film (the nitride doped film) formed according to the process of the present invention by employing the equipment of the ninth embodiment.

Figure 21:
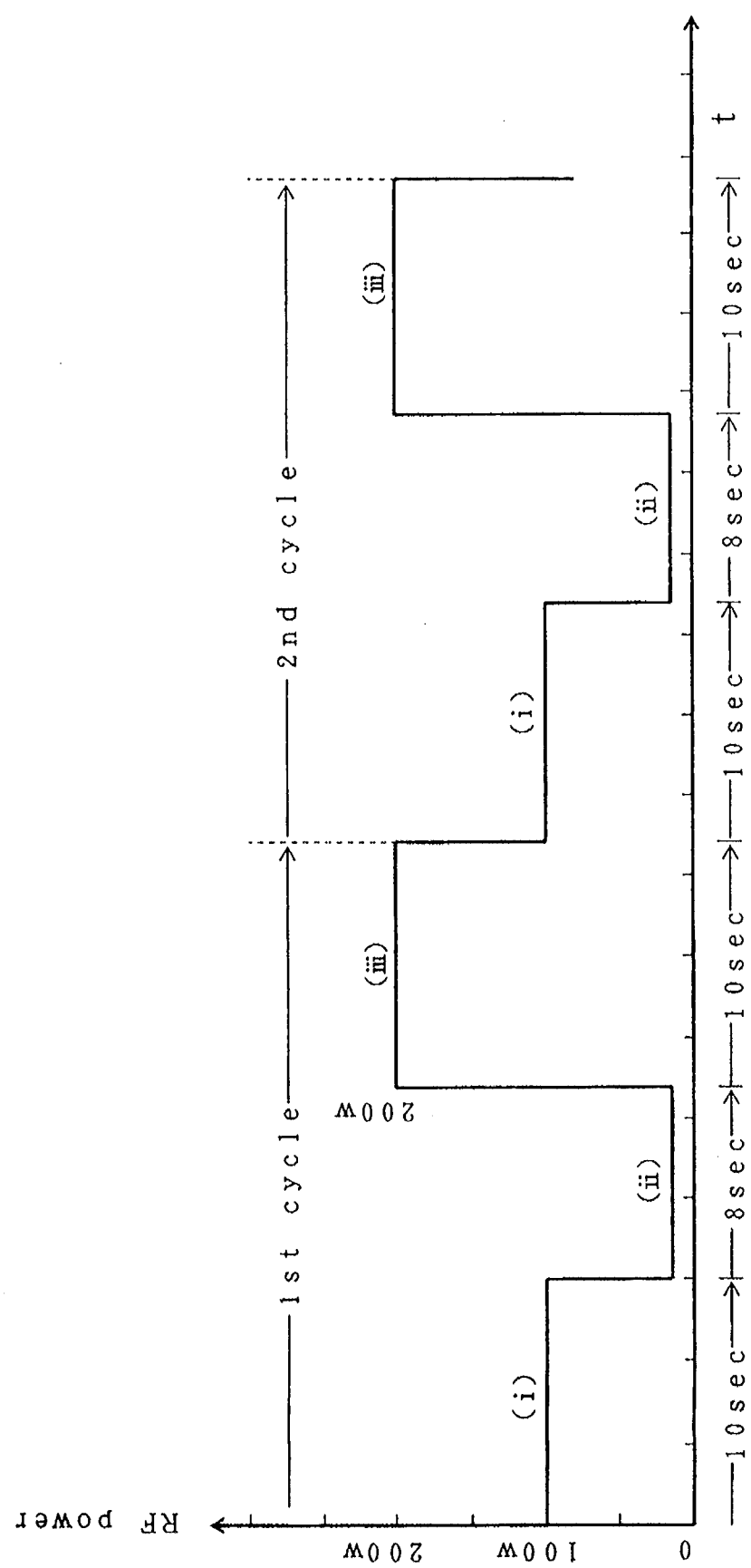
FIG. 21 is a diagram showing the time-chart in the step for forming the composite film in FIGS. 20A and 20B.

FIG. 21 is a diagram showing the step for forming the compound film in FIGS. 20A and 20B.

In the diagram, 150 is a silicon substrate and 151 is a silicon oxide film formed on the silicon substrate 150. Further, 152 is an Al patterned wiring.

By flowing 1~30 sccm of SiH$_4$ and 5~1,000 sccm of H$_2$O, respectively, and keeping the pressure of 1 Torr, plasma power of 100~2,000 W (0.5 W/cm$^2$ of RF power) and the substrate temperature of 350° C., the SiO$_2$ film which does not include silanol is deposited on the Al wiring 152 for 10 seconds and formed so as to have a thickness of 15 nm (STEP (i) in FIG. 21).

After that, plasma power is lowered to 5~30 W (0.1 W/cm$^2$ of RF power) and the film including silanol is formed for 8 seconds so as to have a thickness of 20 nm (STEP (ii) in FIG. 21). After the supply of SiH$_4$ and H$_2$O is stopped, and the supplying gas is switched to ammonia, the plasma power is increased to 200~300 W (1 W/cm$^2$ of RF power) so that the SiO$_2$ film does not include silanol and is transformed to the nitride film (including SiO$_2$) having thickness of 10~20 nm (STEP (iii) in FIG. 21). In this way, the compound film is formed and it is finally flattened by SOG 155.

Further, FIG. 20A is a diagram showing the case for forming the compound film by 1 cycle and FIG. 20B is a diagram showing the example for forming the compound film by repeating 2 cycles.

It is ideal to form the insulating film which does not permeate moisture having a high compressive stress and a thickness of about 150 nm on Al wiring 152 by repeating the cycle 5 times.

Figure 22:
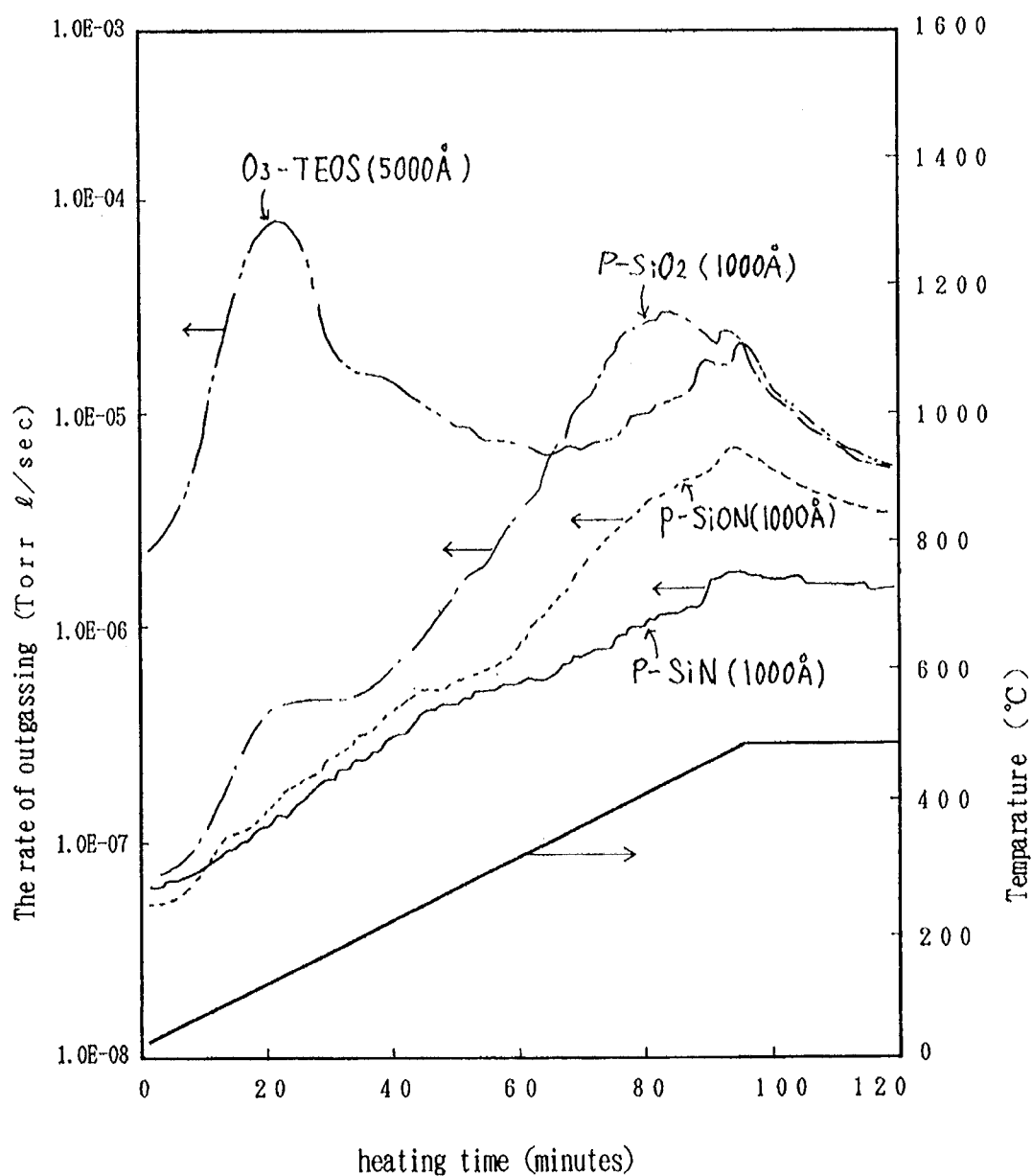
FIG. 22 is a diagram comparing the characteristics of outgassing rates in several films, each having barrier effect for gas diffusion.

The multi-layered wiring for LSIs is barely realized by using a compound multi-layered inter-insulating film. So, it is considered that the use of SOG whose cost is cheaper and which has a better flatness is continued for future. Then, it is required to shut out moisture from SOG perfectly for keeping a high reliability of aluminum. The inventor of the present invention performed an experimentation of outgassing as shown in FIG. 22. In FIG. 22, the three types of films of TEOS (the oxide film), P-SION (the oxide nitride film) and SiN (the nitride film) are used for comparison of a barrier effect for gas diffusion of moisture.

After 500 nm of the $O_3$-TEOS film including much of moisture was deposited, the temperature gradient by outgassing is measured by covering with 100 nm of three types of films each having barrier effect for gas diffusion. The nitride film has a highest barrier effect for gas diffusion, but it has a most powerful tensile stress, so that the reliability is lowered as the power for cutting the Al wiring is activated when this is used for the inter-insulating film. Then, by depositing the plasma nitride film after depositing the plasma CVD oxide film on the side connected to Al, the inter-insulating film having a higher barrier effect for gas diffusion which does not increase the stress on Al directly can be formed. As the nitride film can be thinner when it is made multi-layered by repeating the formation, a dielectric constant of the inter-insulating film is not made higher. This is of advantage to speed up the integrated circuit. This nitride film may be replaced by P-SION (the plasma oxide nitride film or the oxide film including silicon which is not combined to oxygen).

The nitride film has a barrier effect for gas diffusion of moisture, because the film has the strong combination of silicon and nitrogen and the extreme tightness. Because of this thickness, even if nitrogen is appended to $P-SiO_2$, it is not easy to permeate water. It is considered that there is a barrier effect for gas diffusion to trap moisture, simultaneously with that the film including silicon appended to $P-SiO_2$ is tight, as discussed above.

As described above, a barrier effect for gas diffusion of moisture becomes higher, the more the film includes nitrogen, and the quality of the nitride film becomes the best. However, when the nitride film contacts aluminum directly, there is a problem that the aluminum wiring can be cut or damaged. Therefore, the reliability of the film becomes lower. The wiring having a higher reliability can be obtained when the oxide film 153 is employed as the film contacting to the Aluminum wiring 152 and the compound inter-film is formed by covering the oxide film with the nitride film 154 having a higher barrier effect for gas diffusion as shown in FIG. 20A. Further, as shown in FIG. 20B, by laying the oxide film 153 and the nitride film 154 thereupon, successful results are obtained.

Figure 23:
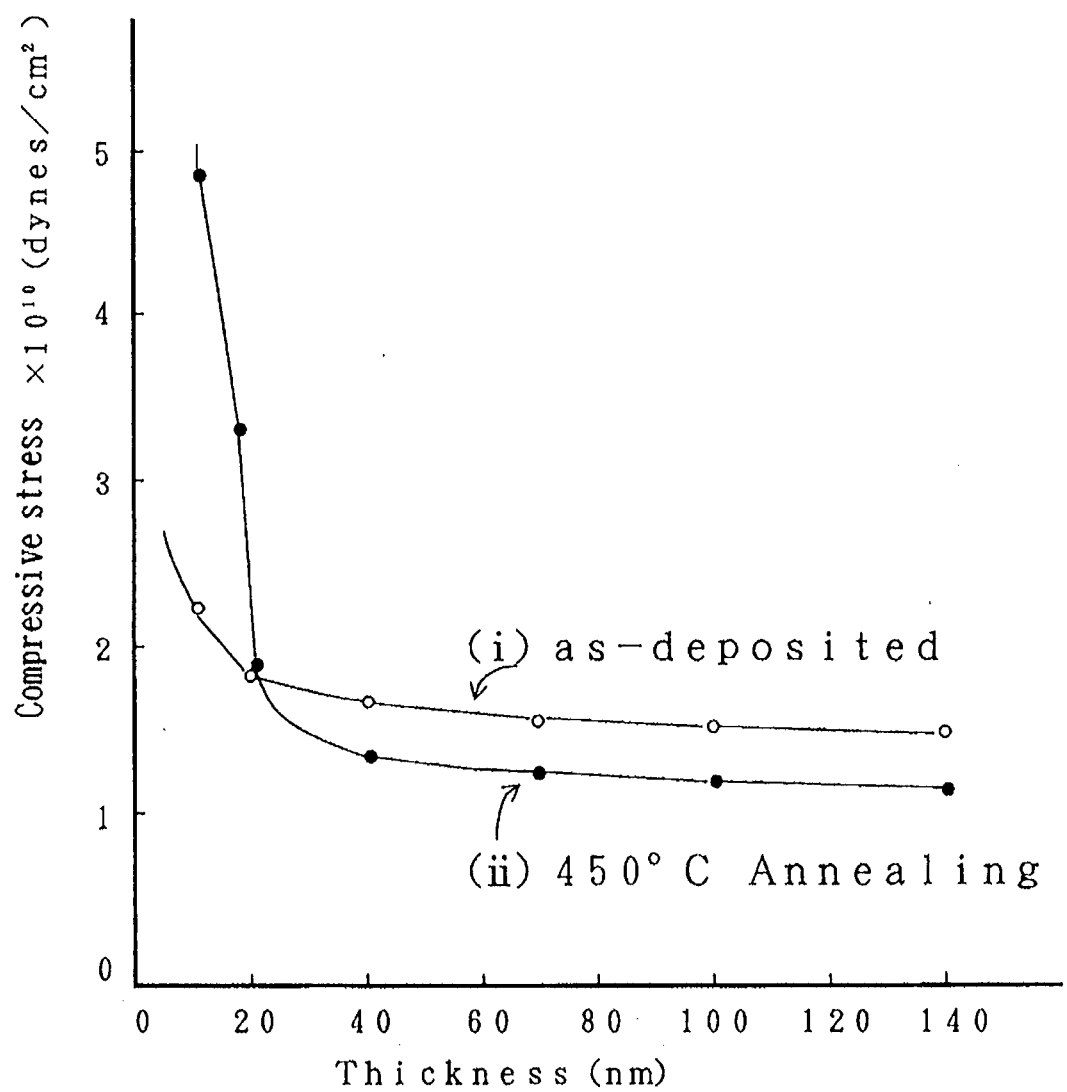
FIG. 23 is a diagram showing the relationship between a nitride film formed by the plasma CVD and the compressive stress.

The inventor of the present invention measured stress by making an experiment of changing the thickness of the nitride film 154 formed by a plasma CVD. FIG. 23 illustrates the result of measurement, and shows the value of measurement which is found immediately after deposition (FIG. 23 (i)) and the value which is found after annealing at 450° C. for 30 minutes in the atmosphere of the compound gas with nitrogen and hydrogen (FIG. 23 (ii)).

As is apparent from this diagram, it was determined that there are areas in which the stress is reduced by annealing and the area in which the stress is increased suddenly at thicknesses 20 nm.

As the more compressive stress increases, the insulating layer between layers of multi-layered wiring obtains improved the reliability. However, the reliability is not improved as desired when the nitride film covers Al wirings and the like directly. The reliability can be improved by taking the process for forming the nitride film 154 of 20 nm or below after the Al wiring is covered by the oxide film 153 at first, as described in relation to FIGS. 20A and 20B.

Further, the more this oxide film 153 and the nitride film 154 are thin and make multi-layered, the more reliability can be improved (refer to FIG. 20B).

ELEVENTH EMBODIMENT

In the prior art, most of the gate oxide film of MOS transistor is formed by thermal oxidation, and it is required to oxidize at the high temperature of about 900° C. or above. Therefore, there is a problem of extending the diffusion area when oxidized after forming the diffusion layer. Although there is a CVD process other than thermal oxidation, there is a problem in that interfacial level is heavy because being formed with the low-temperature. Further, the quality of the film is not good, the leakage current is high and the breakdown value is also low. There is no way, with this prior art, of yielding an acceptable film, even with shifting of flat band voltages.

According to the invention, an example accommodated the gate oxide film to the insulating film having a good quality is shown as follows. Of course, as a plasma CVD process is used in this embodiment, and the insulating film can thereby be formed at the low-temperature.

Figure 24A:
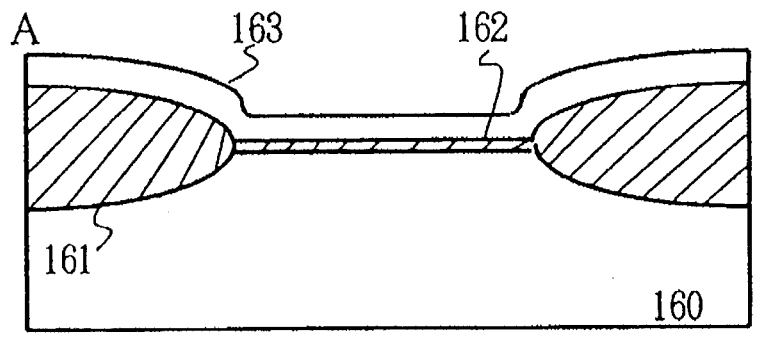
FIGS. 24A through 24C are cross sections in each steps for producing a MOS transistor by using the process for forming a $SiO_2$ film of an eleventh embodiment.
Figure 24B:
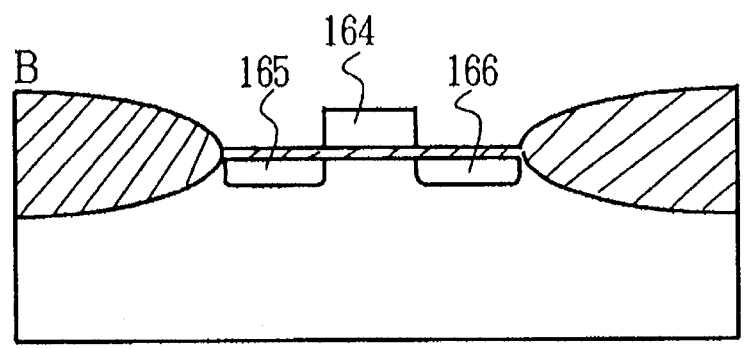
Figure 24C:
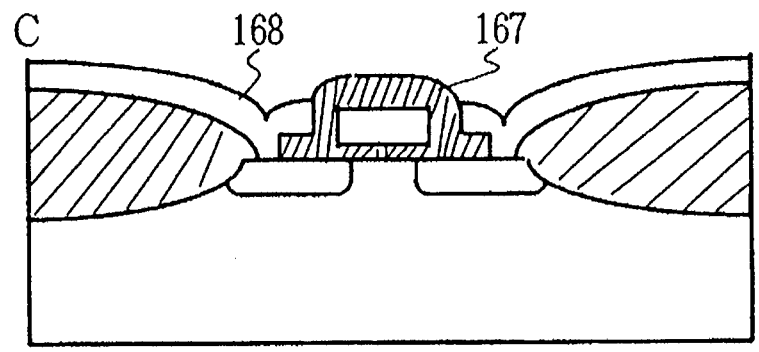

FIGS. 24A through 24C are cross sections showing the step of producing a MOS transistor by the $SiO_2$ film formation process of an eleventh embodiment. In this diagram, 160 is a silicon substrate, 161 is a LOCOS oxide film (a $SiO_2$ film), 162 is a gate insulating film, 163 is a polysilicon film, 164 is a gate electrode, 165 is a source area, 166 is a drain area and 167 is an oxide film and 168 is a source/drain lead electrode.

FIRST STEP (referring to FIG. 24A)

The gate insulating film 162 having the thickness of 30 nm is formed depending by supplying water+$SiH_4$, after the LOCOS oxide film (the $SiO_2$ film) 161 is formed on the silicon substrate 160, and keeping the substrate temperature at 400° C. by the CVD process.

The polysilicon film 163 having the thickness of 500 nm is formed on the film 162 by the CVD process.

SECOND STEP (referring to FIG. 24B)]

The source area 165 and the drain area 166 are formed by using the gate electrode 165 as a mask, ion-injection of $A_s$ after removed the outer polysilicon film 163 which is not used as a transistor.

THIRD STEP (referring to FIG. 24C)

The oxide film 167 is formed by the CVD process, in order to open the contact hole in the source and drain. The MOS transistor is completed by forming the electrode on the source and drain.

Gate electrode 165 is then formed by depositing and patterning the polysilicon film which has the thickness of 300 nm.

The thin-film transistor (TFT) is formed by using this gate electrode 165 as a mask, ion-injection $A_s$ and forming the source area 166 and the drain area 167.

FIG. 25 is a diagram showing relationships of a gate oxide film of a MOS diode grown by a process for forming each type of oxide film. There is a problem that the oxide film which is used the organic TEOS as the feed gas and formed by the CVD process has low breakdown value of which the interfacial level is high, in comparison with the conventional thermally oxidized film. It has the same character as the thermally oxidized film, no matter what the film formed by the inorganic feed of water and $SiH_4$ deposited at 400° C. of the low temperature.

All conventional oxide films, such as $SiH_4$-oxide group plasma, had a problem about the interfacial level. Although the inventor of the present invention expected as a matter of course that the interfacial level of water+$SiH_4$ plasma CVD oxide film (iii) is also increased, it was found out that the interfacial characteristic was very good, contrary to their expected result. It is considered that this is why water absorbs electrons and ions in plasma, the electric field accelerating each one is made smaller, and the damage is indemnified by the produced hydrogen. This is improved for the first time in relation to the embodiment of the present invent ion by the combination of water+a silane group gas+plasma. Although this is the result of experimentation of performing the plasma CVD process at 300° C. and 400° C., the oxide film having the same quality is formed, when it is 200° C. or above.

As discussed above, the present invention can cover the minute drop portion which could not cover perfectly according to the silicon oxide film which is formed by the conventional process perfectly, for example, the silicon oxide film which has covering and a good quality can be formed even if it is on the deep trends or the hole, so that the degree of integration of LSI can be greatly improved.

Further, the present invention can improve the equality of the distribution of the quality of the film of the wafer oxide film, so that the insulating film having a flatness and high reliability can be formed effectively. Further, it can improve the reliability of the wiring formed on that layer.

Furthermore, the present invention can improve the most infinitesimal device as the gate oxide film can be formed at the low-temperature according to the first mode of the present invention. The degree of integration can thereby be improved. Then, the MOS transistor can be formed at the low temperature and an inexpensive glass substrate can be used, so that it has the effect of reducing overall costs. The film has a good quality and a high reliability in proportion to being cost effectively produced. The distribution of forming the film is significantly improved and is easily formed, and therefore simplifies the device.

The invention may be embodied in other specific form without departing from the spirit or essential characteristics thereof.

The disclosed embodiments are therefore to be considered in all respects as illustrative and not restrictive, the scope of the invention being indicated by the appended claims rather than by the foregoing description and all changes, which come within the meaning and range of equivalency of the claims therefore intended to be embraced therein.

What is claimed is:

1. A process for producing of a semiconductor device, comprising:

a first step of forming a film comprising an inorganic silanol by performing a plasma CVD at a plasma energy value of no greater than 40 (W·°C./cm$^2$) and using a silane group gas and water as a feed gas; and a second step of treating the film under conditions sufficient to anneal said film or to plasma irradiate said film under conditions sufficient to convert said film to a film comprising a silicon oxide.

2. A process for producing a semiconductor device according to claim 1, wherein the plasma discharge of the feed gas is caused by applying an exciting electric power intermittently.

3. A process as claimed in claim 1, wherein said CVD process is carried out under low power conditions sufficient to provide substantially all of the hydrogen in said film in the form of inorganic silanols of the formula: Si-(OH)$_x$.

4. A process for producing of a semiconductor device comprising:

a first step of forming a film comprising an inorganic silanol by performing a plasma CVD at an energy value of not more than 40 (W·°C./cm$^2$) using a silane group gas and $H_2O$ as a feed gas; and a second step of transforming the film comprising said inorganic silanol, to a nitride film by treating said film with an ammonia plasma under conditions sufficient to form a nitride in said film.

5. A process for producing of a semiconductor device according to claim 4, wherein the feed gas is plasma discharged by impressing an exciting electric power intermittently.

6. A process as claimed in claim 4, wherein said CVD process is carried out under low power conditions sufficient to provide substantially all of the hydrogen in said film in the form of inorganic silanols of the formula: Si-(OH)$_x$.

7. A process for producing a semiconductor device comprising:

a first step of forming a $SiO_2$ film without a silanol by a plasma CVD process, using a silane group gas and water as a feed gas, a second step of forming a second film, comprising an inorganic silanol, by a further plasma CVD process with a plasma energy value of no greater than 40 (W·°C./cm$^2$), using a silane group gas and $H_2O$ as a feed gas, on said $SiO_2$ film; and a third step of transforming the second film comprising an inorganic silanol to a film comprising a nitride by stopping the supply of said silane group gas and water to said further plasma CVD process and feeding an ammonia plasma into contact with said second film.

8. A process as claimed in claim 7, wherein said second CVD process is carried out under low power conditions sufficient to provide substantially all of the hydrogen in said film in the form of inorganic silanols of the formula: Si-(OH)$_x$.

* * * * *